United States Patent
Suzuki

(10) Patent No.: US 11,823,924 B2
(45) Date of Patent: Nov. 21, 2023

(54) SEMICONDUCTOR MANUFACTURING APPARATUS, AND METHOD OF MANUFACTURING SEMICONDUCTOR DEVICE

(71) Applicant: Kioxia Corporation, Tokyo (JP)

(72) Inventor: Aoi Suzuki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/460,971

(22) Filed: Aug. 30, 2021

(65) Prior Publication Data

US 2022/0285181 A1 Sep. 8, 2022

(30) Foreign Application Priority Data

Mar. 8, 2021 (JP) .................. 2021-036524

(51) Int. Cl.
*H01L 21/67* (2006.01)
*H01L 23/00* (2006.01)

(52) U.S. Cl.
CPC .. *H01L 21/67207* (2013.01); *H01L 21/67092* (2013.01); *H01L 21/67115* (2013.01); *H01L 24/75* (2013.01); *H01L 24/83* (2013.01); *H01L 24/94* (2013.01); *H01L 24/29* (2013.01); *H01L 24/32* (2013.01); *H01L 2224/29186* (2013.01); *H01L 2224/32145* (2013.01); *H01L 2224/75263* (2013.01); *H01L 2224/75802* (2013.01);
(Continued)

(58) Field of Classification Search
CPC ......... H01L 21/67092; H01L 21/67098; H01L 21/67103; H01L 21/67109; H01L 21/67115; H01L 2224/74; H01L 2224/7999; H01L 2224/80; H01L 2224/80001; H01L 2224/80003; H01L 2224/80004; H01L 2224/8003; H01L 2224/80039; H01L 2224/802; H01L 2224/802224; H01L 2224/8319; H01L 2224/83193
See application file for complete search history.

(56) References Cited

U.S. PATENT DOCUMENTS

| 8,759,951 B2 | 6/2014 | Mitani |
| 2009/0203167 A1 | 8/2009 | Mitani |

(Continued)

FOREIGN PATENT DOCUMENTS

| JP | 4839818 B2 | 12/2011 |
| JP | 6608732 B2 | 11/2019 |

(Continued)

*Primary Examiner* — Julio J Maldonado
*Assistant Examiner* — Stanetta D Isaac
(74) *Attorney, Agent, or Firm* — Oblon, McClelland, Maier & Neustadt, L.L.P.

(57) ABSTRACT

In one embodiment, a semiconductor manufacturing apparatus includes a reformer configured to partially reform a first substrate to form a reformed layer between a first portion and a second portion in the first substrate. The apparatus further includes a joiner configured to form a joining layer between the first portion and a second substrate to join the first portion and the second substrate. The apparatus further includes a remover configured to remove the second portion from a surface of the second substrate while making the first portion remain on the surface of the second substrate by separating the first portion and the second portion.

13 Claims, 22 Drawing Sheets

(52) U.S. Cl.
CPC ............ *H01L 2224/83224* (2013.01); *H01L 2224/83896* (2013.01); *H01L 2224/83986* (2013.01); *H01L 2924/4015* (2013.01); *H01L 2924/40503* (2013.01)

(56) References Cited

U.S. PATENT DOCUMENTS

| | | | | |
|---|---|---|---|---|
| 2014/0235032 | A1* | 8/2014 | Akiyama | .......... H01L 21/76256 438/458 |
| 2021/0039203 | A1 | 2/2021 | Tanoue | |
| 2021/0327772 | A1* | 10/2021 | Tanoue | ................ H01L 21/304 |

FOREIGN PATENT DOCUMENTS

| | | |
|---|---|---|
| JP | 2020-72238 A | 5/2020 |
| JP | 2020-136448 A | 8/2020 |
| JP | 2020-167303 A | 10/2020 |
| WO | WO 2019/176589 A1 | 9/2019 |
| WO | WO 2019/208298 A1 | 10/2019 |

\* cited by examiner

SEMICONDUCTOR MANUFACTURING APPARATUS, AND METHOD OF MANUFACTURING SEMICONDUCTOR DEVICE

CROSS REFERENCE TO RELATED APPLICATION

This application is based upon and claims the benefit of priority from the prior Japanese Patent Application No. 2021-036524, filed on Mar. 8, 2021, the entire contents of which are incorporated herein by reference.

FIELD

Embodiments described herein relate to a semiconductor manufacturing apparatus, and a method of manufacturing a semiconductor device.

BACKGROUND

When a semiconductor device is manufactured by bonding substrates with each other, the substrates are often processed by, for example, trimming or grinding. In such a case, it is desirable to process the substrates by a suitable method.

DETAILED DESCRIPTION

Embodiments will now be explained with reference to the accompanying drawings. In FIGS. 1 to 22B, same signs are attached to same configurations and redundant description is omitted.

In one embodiment, a semiconductor manufacturing apparatus includes a reformer configured to partially reform a first substrate to form a reformed layer between a first portion and a second portion in the first substrate. The apparatus further includes a joiner configured to form a joining layer between the first portion and a second substrate to join the first portion and the second substrate. The apparatus further includes a remover configured to remove the second portion from a surface of the second substrate while making the first portion remain on the surface of the second substrate by separating the first portion and the second portion.

First Embodiment

Figure 1:
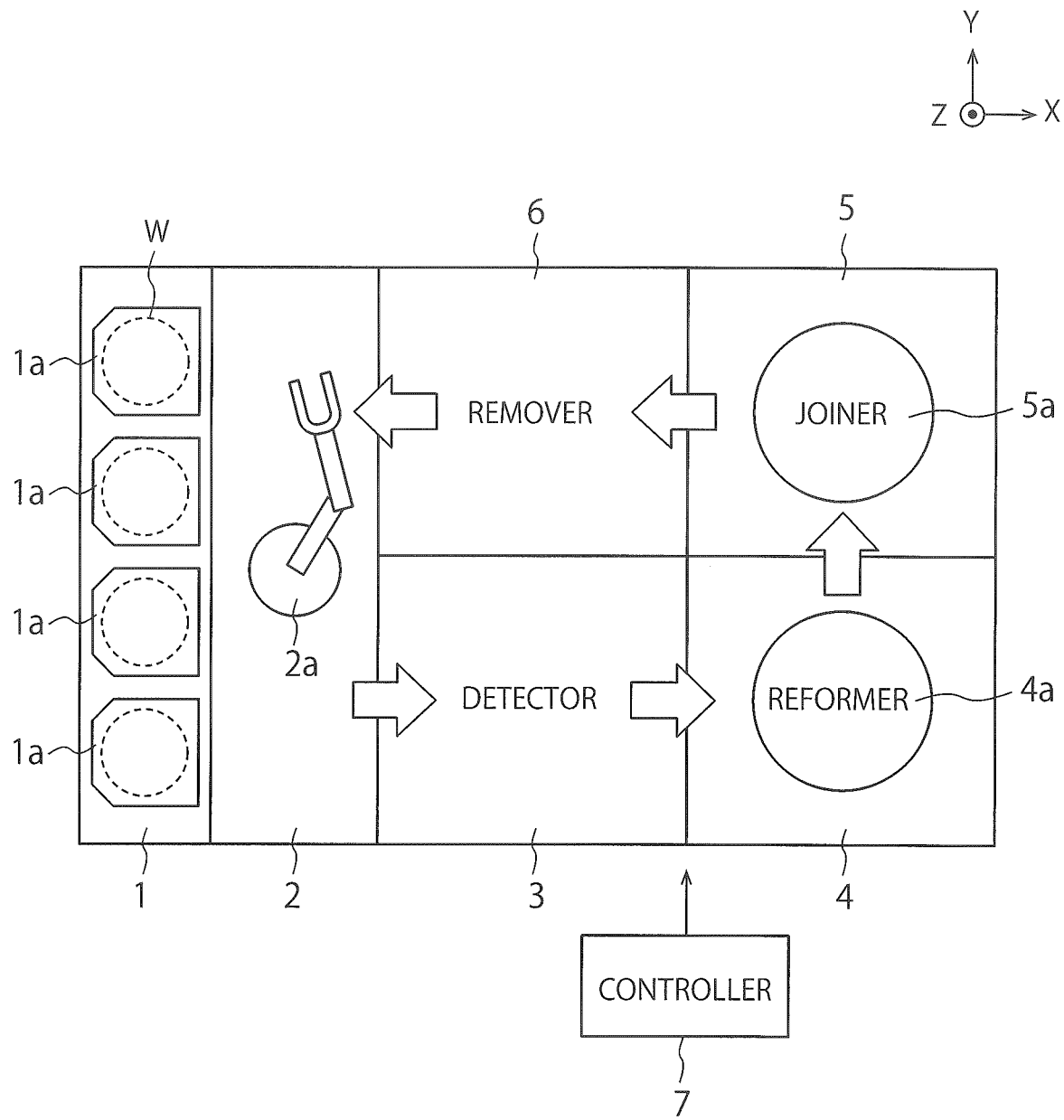
FIG. 1 is a plan view illustrating a structure of a semiconductor manufacturing apparatus of a first embodiment.

FIG. 1 is a plane view illustrating a structure of a semiconductor manufacturing apparatus of a first embodiment.

The semiconductor manufacturing apparatus of the present embodiment includes a load module 1, a conveyer 2, a detector 3, a reformer 4, a joiner 5, a remover 6 and a controller 7. The load module 1 includes a plurality of load ports 1a, and the conveyer 2 includes a conveying robot 2a. The reformer 4 includes a chuck table 4a, and the joiner 5 includes a chuck table 5a.

FIG. 1 illustrates an X direction, a Y direction and a Z direction vertical to each other. In this description, a +Z direction is handled as an upper direction, and a −Z direction is handled as a lower direction. The −Z direction may coincide with a gravity direction, or may not coincide with the gravity direction.

The semiconductor manufacturing apparatus of the present embodiment is used to process a wafer W. As to be described later, the wafer W of the present embodiment includes a lower wafer and an upper wafer, and has a structure that the two wafers are bonded together. Further details of the wafer W will be described later.

The load module 1 is used to load an FOUP (Front Opening Unified Pod) for housing the wafer W. When the wafer W is to be carried into an enclosure of the semiconductor manufacturing apparatus, the FOUP housing the wafer W is loaded on any one load port 1a, and the wafer W is carried into the enclosure from the FOUP. On the other hand, the wafer W carried out from the enclosure is housed in the FOUP on any one load port 1a.

The conveyer 2 conveys the wafer W in the enclosure by the conveying robot 2a. The detector 3 performs notch alignment of the wafer W conveyed by the conveyer 2, and detects a center of the wafer W further. The reformer 4 loads the wafer W conveyed from the detector 3 on the chuck table 4a, and partially reforms (modifies) the upper wafer in the wafer W. The joiner 5 loads the wafer W conveyed from the reformer 4 onto the chuck table 5a, and partially joins the upper wafer and the lower wafer in the wafer W. The remover 6 partially removes the upper wafer in the wafer W conveyed from the joiner 5. The wafer W which has passed through the detector 3, the reformer 4, the joiner 5 and the remover 6 is carried out of the enclosure by the conveyer 2.

The controller 7 controls various operations of the semiconductor manufacturing apparatus of the present embodiment. For example, the controller 7 controls the conveying robot 2a to convey the wafer W, and controls the chuck tables 4a and 5a to rotate the wafer W.

FIGS. 2A to 8B are sectional views and plan views illustrating a method of manufacturing a semiconductor device of the first embodiment.

A semiconductor device of the present embodiment is manufactured from the wafer W illustrated in FIG. 1. In addition, a part of the method of manufacturing the semiconductor device of the present embodiment is executed using the semiconductor manufacturing apparatus illustrated in FIG. 1. Therefore, in the following description, signs illustrated in FIG. 1 are appropriately used.

Figure 2A:
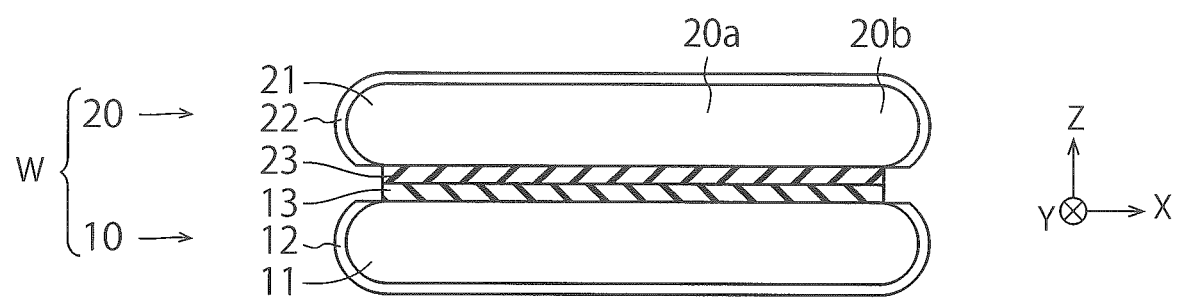
FIGS. 2A to 8B are sectional views and plan views illustrating a method of manufacturing a semiconductor device of the first embodiment.
Figure 2B:
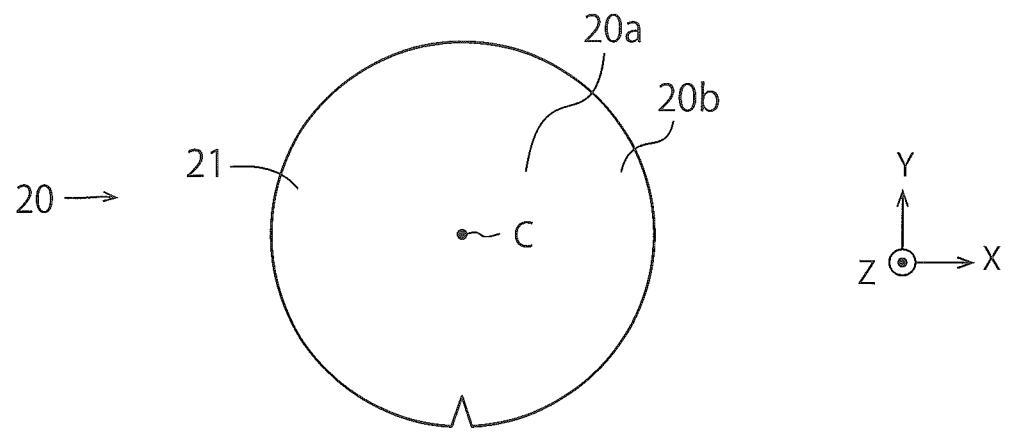

FIG. 2A illustrates a sectional shape of the wafer W, and FIG. 2B illustrates a planar shape of the wafer W. It is similar for FIGS. 3A to 8B.

First, the wafer W illustrated in FIG. 2A and FIG. 2B is prepared. As described above, the wafer W of the present embodiment includes a lower wafer 10 and an upper wafer 20, and has the structure that the lower wafer 10 and the upper wafer 20 are bonded together. However, in a stage illustrated in FIG. 2A and FIG. 2B, the lower wafer 10 and the upper wafer 20 are not joined yet. The upper wafer 20 is an example of a first substrate, and the lower wafer 10 is an example of a second substrate.

The lower wafer 10 includes a semiconductor wafer 11, a film 12 formed on a lower face and a side face of the semiconductor wafer 11, and a film 13 formed on an upper face of the semiconductor wafer 11. The upper wafer 20 includes a semiconductor wafer 21, a film 22 formed on an upper face and a side face of the semiconductor wafer 21, and a film 23 formed on a lower face of the semiconductor wafer 21. The upper wafer 20 is mounted on the lower wafer 10 in a form that the film 13 and the film 23 are bonded together.

Each of the semiconductor wafers 11 and 21 is a silicon wafer, for example. Each of the films 13 and 23 includes various insulators such as an inter layer dielectric, a line layer, a plug layer and a pad layer, a semiconductor layer and a conductor layer, for example. The films 13 and 23 may include a device such as a memory cell array or a transistor, for example. Each of the films 13 and 23 of the present embodiment includes a silicon oxide film on an interface of the film 13 and the film 23, and the silicon oxide film in the film 13 and the silicon oxide film in the film 23 are bonded together.

FIG. 2A and FIG. 2B illustrate a center C of the upper wafer 20, a center portion 20a which is a portion on a side of the center C in the upper wafer 20, and an outer peripheral portion 20b which is a portion on an opposite side of the center C in the upper wafer 20. The center of the lower wafer 10 is positioned almost right below (−Z direction) the center C of the upper wafer 20 as a result of alignment by the detector 3. In the method of manufacturing the semiconductor device of the present embodiment, by a process to be described later, the outer peripheral portion 20b of the upper wafer 20 is removed from the wafer W. The center portion 20a is an example of a first portion, and the outer peripheral portion 20b is an example of a second portion.

Figure 3A:
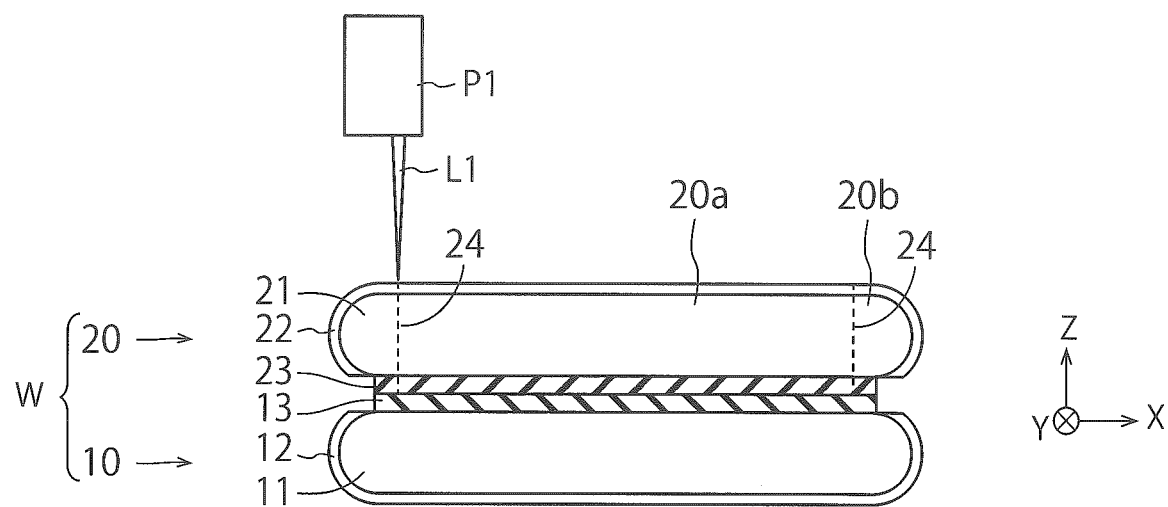
Figure 3B:
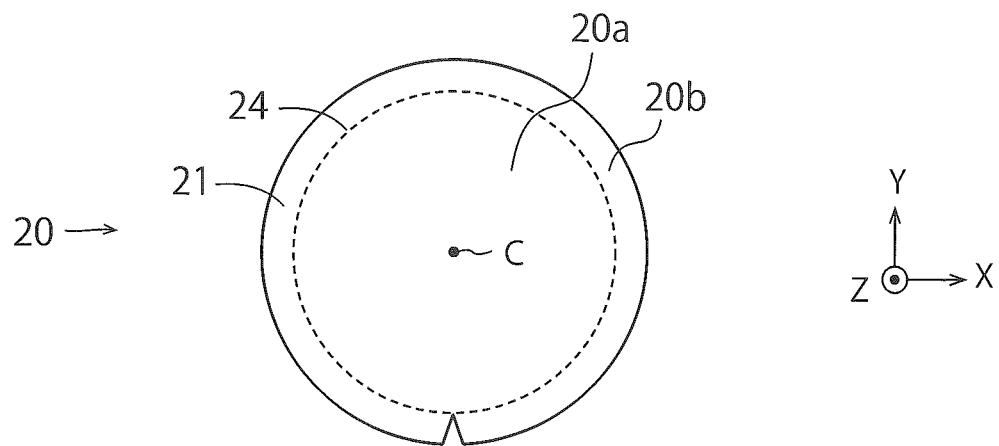

Next, the upper wafer 20 is partially reformed, and a reformed layer 24 is formed between the center portion 20a and the outer peripheral portion 20b in the upper wafer 20 (FIG. 3A and FIG. 3B). FIG. 3A illustrates an emitter P1 which is provided in the reformer 4 and emits a laser L1. The reformed layer 24 of the present embodiment is formed by irradiating the upper wafer 20 with the laser L1, and is specifically formed at a part irradiated with the laser L1. In the present embodiment, the part irradiated with the laser L1 is amorphized, and monocrystalline silicon in the semiconductor wafer 21 is changed to amorphous silicon. Accordingly, an amorphous layer is formed as the reformed layer 24.

As illustrated in FIG. 3A, the reformed layer 24 of the present embodiment is formed so as to extend in the −Z direction in the upper wafer 20 and pass through the upper wafer 20. In addition, the reformed layer 24 of the present embodiment is formed in the upper wafer 20 so as to have an annular planar shape as illustrated in FIG. 3B. Therefore, the center portion 20a illustrated in FIG. 3B, that is, a portion on an inner side of the reformed layer 24 in the upper wafer 20 has a circular planar shape. On the other hand, the outer peripheral portion 20b illustrated in FIG. 3B, that is, a portion on an outer side of the reformed layer 24 in the upper wafer 20 has the annular planar shape, and annularly surrounds the center portion 20a. The reformed layer 24 is formed by loading the wafer W on the chuck table 4a and irradiating the wafer W with the laser L1 while rotating the chuck table 4a, for example. A wavelength of the laser L1 is desirably set at such a value at which the laser L1 is not absorbed by the semiconductor wafer 21, and is set at 1117 nm or longer for example.

The reformed layer 24 may be formed so as to have a shape different from the shape illustrated in FIG. 3A and FIG. 3B. For example, the reformed layer 24 may be formed such that the planar shape of the center portion 20a becomes a non-circular shape. In addition, in a case where the planar shape of the center portion 20a is circular, a value of a diameter of the center portion 20a may be set at any value according to a size of the outer peripheral portion 20b desired to be removed from the wafer W. Further, the reformed layer 24 is formed after the upper wafer 20 and the lower wafer 10 are bonded together in the present embodiment, but may be formed before the upper wafer 20 and the lower wafer 10 are bonded together instead.

Figure 4A:
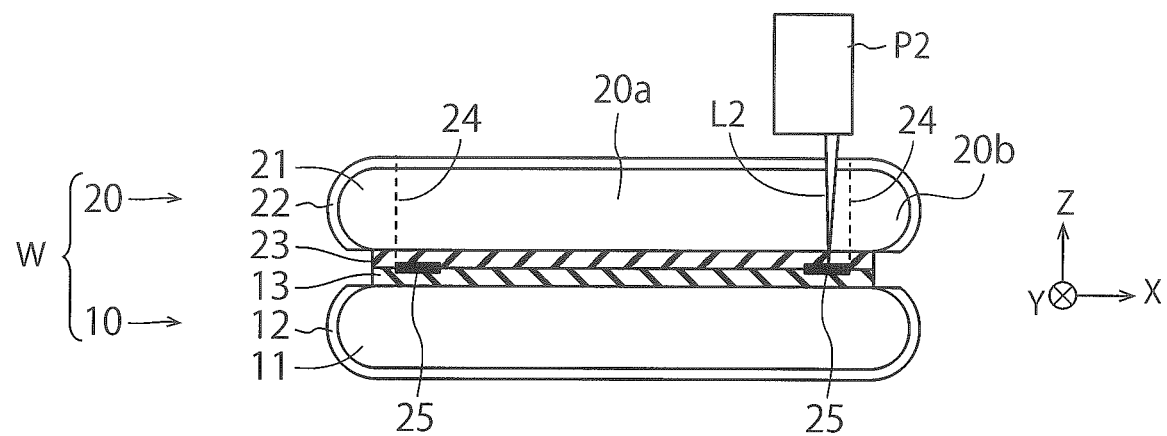
Figure 4B:
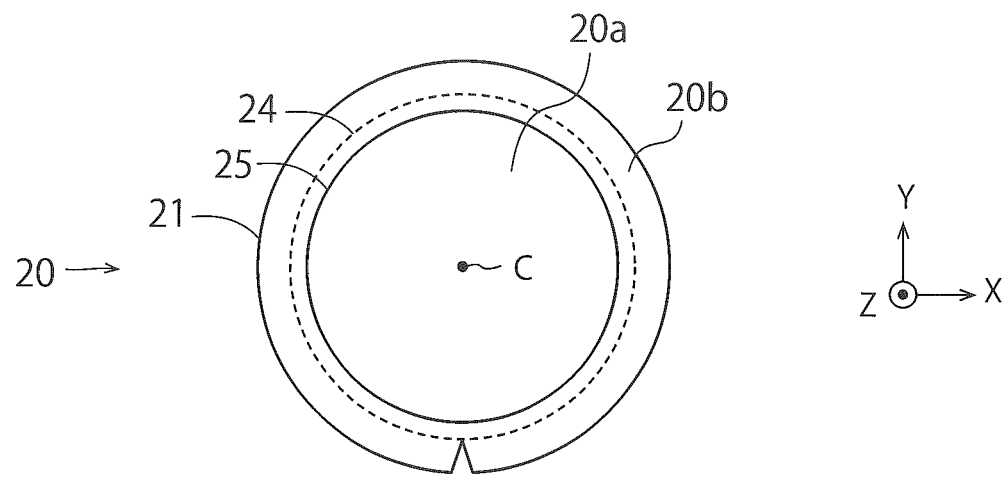

Next, between the center portion 20a and the lower wafer 10, a joining layer 25 which joins the center portion 20a and the lower wafer 10 is formed (FIG. 4A and FIG. 4B). FIG. 4A illustrates an emitter P2 which is provided in the joiner 5 and emits a laser L2. The joining layer 25 of the present embodiment is formed by irradiating the films 13 and 23 with the laser L2, and is specifically formed at a part irradiated with the laser L2. The laser L2 of the present embodiment generates heat by being absorbed by the films 13 and 23, and forms the joining layer 25 by causing dehydration condensation by the heat in the films 13 and 23. Therefore, it is desirable that the interface of the films 13 and 23 of the present embodiment is formed of a material which absorbs the laser L2. An example of such a material is a silicon oxide film. The wavelength of the laser L2 is desirably set at such a value at which the laser L2 is absorbed by the films 13 and 23, and is set at 9400 nm or 11500 nm for example.

The joining layer 25 of the present embodiment is formed near the interface of the film 13 and the film 23 in the films 13 and 23, as illustrated in FIG. 4A. In addition, the joining layer 25 of the present embodiment is formed so as to have the annular planar shape, as illustrated in FIG. 4B. The joining layer 25 is formed between the center portion 20a and the lower wafer 10 and is therefore formed more on the side of the center C than the reformed layer 24. The joining layer 25 of the present embodiment is formed near the reformed layer 24. In addition, the joining layer 25 of the present embodiment is formed only in the center portion 20a of the center portion 20a and the outer peripheral portion 20b. The joining layer 25 is formed by loading the wafer W on the chuck table 5a and irradiating the wafer W with the laser L2 while rotating the chuck table 5a, for example.

The joining layer 25 may be formed to have a shape different from the shape illustrated in FIG. 4A and FIG. 4B.

An example of such a joining layer 25 will be described later. Further, the joining layer 25 is formed after the reformed layer 24 is formed in the present embodiment, but may be formed before the reformed layer 24 is formed instead.

Figure 5A:
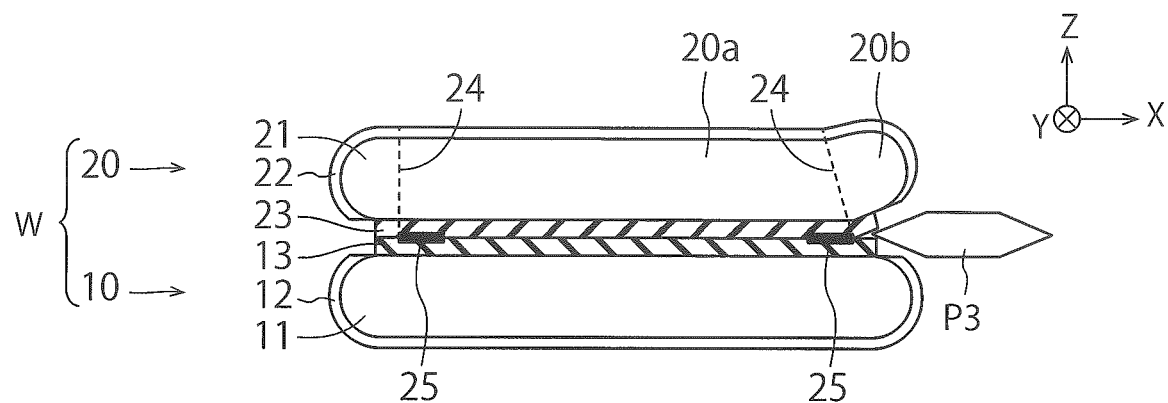
Figure 5B:
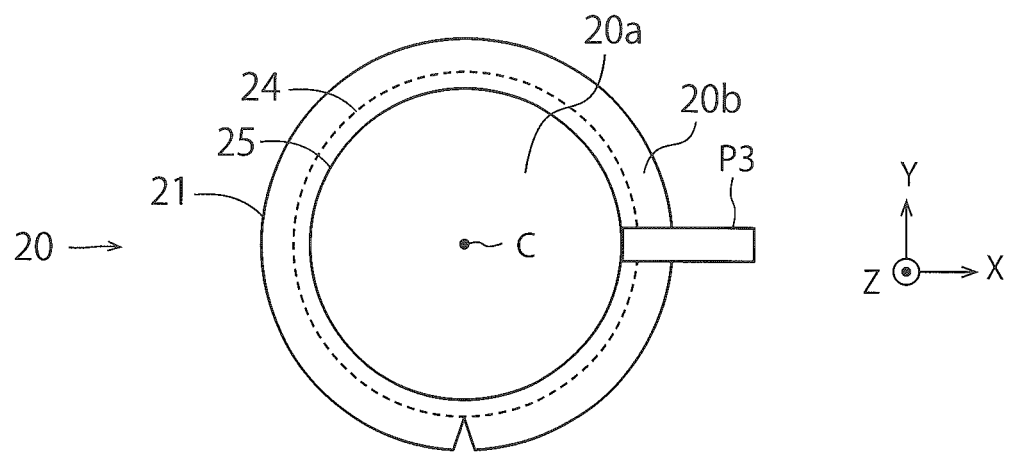
Figure 6A:
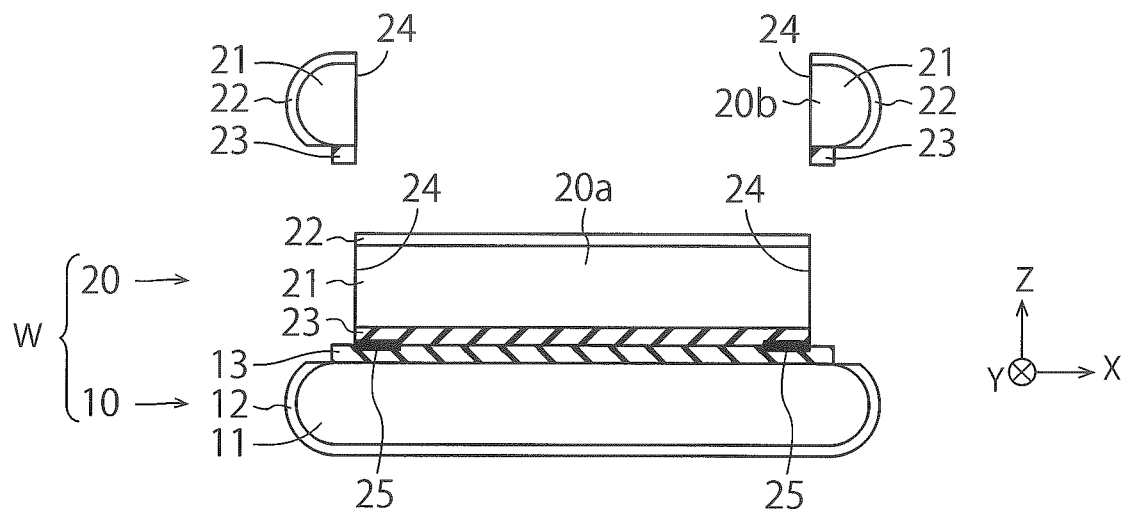
Figure 6B:
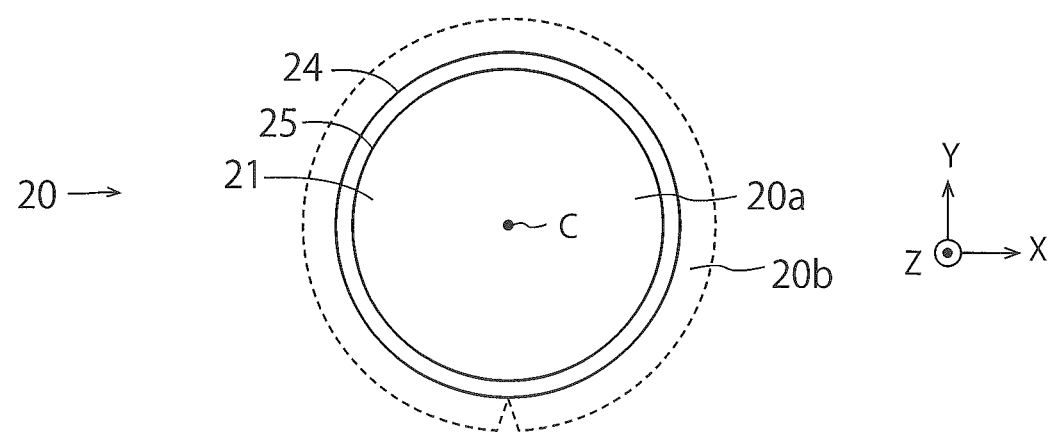

Next, a blade P3 is inserted between the lower wafer 10 and the upper wafer 20, and the wafer W is rotated in a state where the blade P3 is inserted (FIG. 5A and FIG. 5B). Accordingly, by separating the center portion 20a and the outer peripheral portion 20b, the outer peripheral portion 20b is removed from the surface of the lower wafer 10 while making the center portion 20a remain on the surface of the lower wafer 10 (FIG. 6A and FIG. 6B).

The process illustrated in FIG. 5A and FIG. 5B is performed by the blade P3 in the remover 6. The outer peripheral portion 20b is peeled from the lower wafer 10 by force applied from the blade P3. On the other hand, the center portion 20a is joined with the lower wafer 10 by the joining layer 25 so that the center portion 20a is not peeled from the lower wafer 10 even when the force is applied from the blade P3. Therefore, strain is accumulated on the interface of the lower wafer 10 and the upper wafer 20, and stress is released in the form of destroying the reformed layer 24. As a result, the center portion 20a and the outer peripheral portion 20b are separated at the reformed layer 24, and the outer peripheral portion 20b is completely peeled from the lower wafer 10. In such a manner, the outer peripheral portion 20b is removed from the surface of the lower wafer 10 and the center portion 20a remains on the surface of the lower wafer 10 (FIG. 6A and FIG. 6B). In other words, the wafer W is trimmed so as to remove the outer peripheral portion 20b. The blade P3 is an example of an inserting member.

Thereafter, the wafer W of the present embodiment is carried out of the enclosure of the semiconductor manufacturing apparatus by the conveying robot 2a. In addition, the outer peripheral portion 20b removed from the wafer W is also carried out of the enclosure by the conveying robot 2a. The conveying robot 2a is an example of a conveying mechanism. In general trimming, since the outer peripheral portion 20b is removed by shaving the outer peripheral portion 20b, the outer peripheral portion 20b is turned into a large amount of powder and removed from the wafer W. On the other hand, in the trimming of the present embodiment, since the outer peripheral portion 20b is removed by separating the outer peripheral portion 20b from the center portion 20a and peeling the outer peripheral portion 20b from the lower wafer 10, the outer peripheral portion 20b is removed from the wafer W without being turned into the large amount of powder. Therefore, the present embodiment makes it possible to easily carry the outer peripheral portion 20b out of the enclosure by the conveying robot 2a, and suppress time and labor of removing the large amount of powder from the enclosure. The semiconductor manufacturing apparatus of the present embodiment may carry the outer peripheral portion 20b out of the enclosure by a conveying mechanism other than the conveying robot 2a. The outer peripheral portion 20b is collected into the FOUP, for example.

Figure 7A:
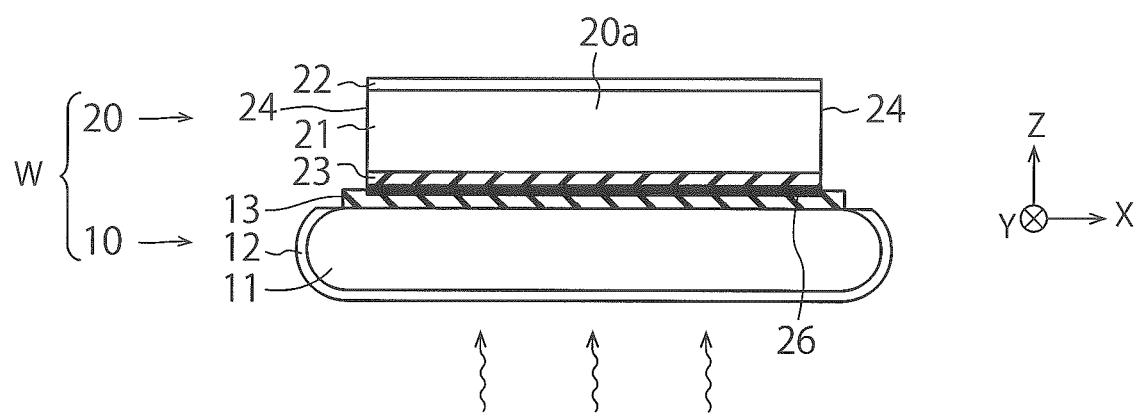
Figure 7B:
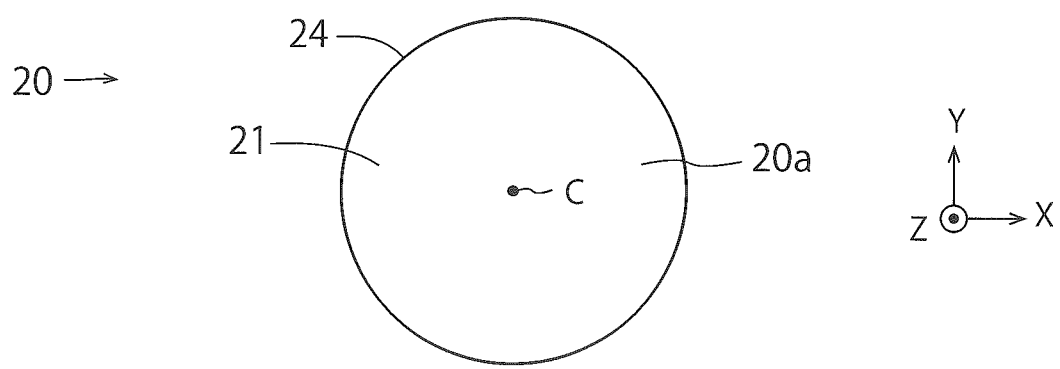

Next, the wafer W is annealed (FIG. 7A and FIG. 7B). As a result, the entire lower face of the film 23 is joined with the upper face of the film 13, and a joining layer 26 is formed near the interface of the film 13 and the film 23 in the films 13 and 23. In such a manner, the lower wafer 10 and the upper wafer 20 are joined by the joining layer 26. The process illustrated in FIG. 7A and FIG. 7B is performed by a device other than the semiconductor manufacturing apparatus of the present embodiment.

Figure 8A:
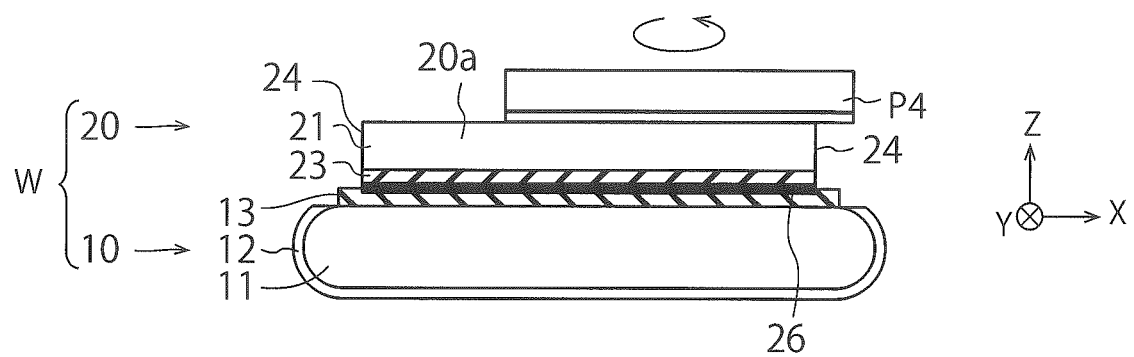
Figure 8B:
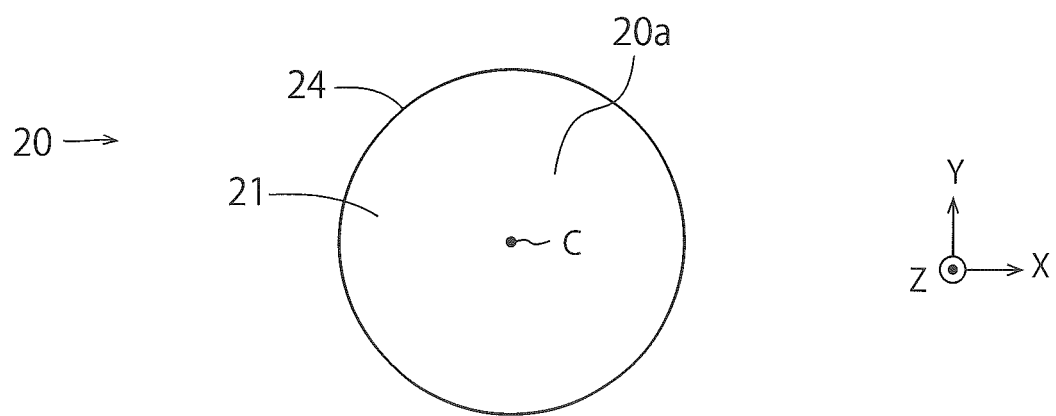

Then, the upper face of the upper wafer 20 is ground by a grinder P4 (FIG. 8A and FIG. 8B). As a result, the upper wafer 20 is made into a thin film. The process illustrated in FIG. 8A and FIG. 8B is performed by a device other than the semiconductor manufacturing apparatus of the present embodiment.

Thereafter, the wafer W is processed by various processes. In this way, the semiconductor device of the present embodiment is manufactured. The semiconductor device of the present embodiment is a three-dimensional semiconductor memory for example.

FIGS. 9A to 11B are sectional views illustrating the method of manufacturing the semiconductor device of a first comparative example of the first embodiment. In the present comparative example, the upper wafer 20 is trimmed before the lower wafer 10 and the upper wafer 20 are bonded together.

Figure 9A:
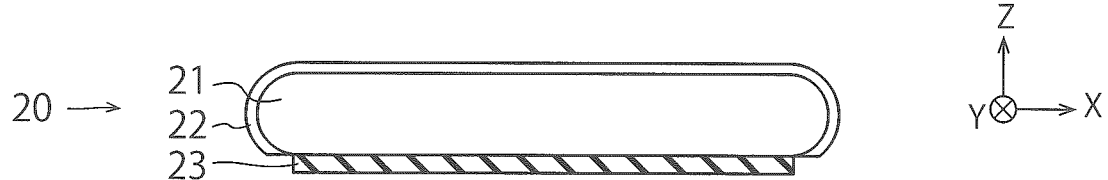
FIGS. 9A to 11B are sectional views illustrating a method of manufacturing a semiconductor device of a first comparative example.
Figure 9B:
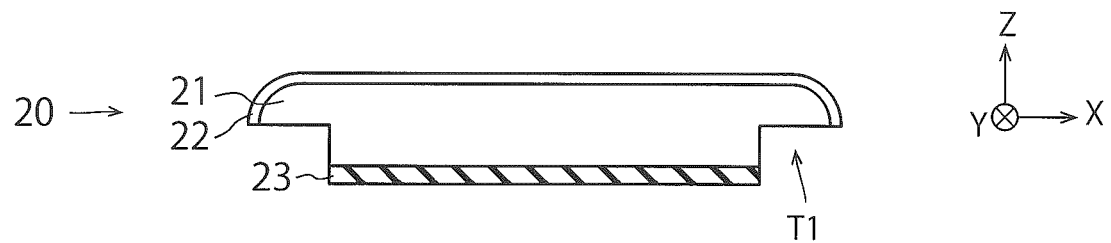
Figure 10A:
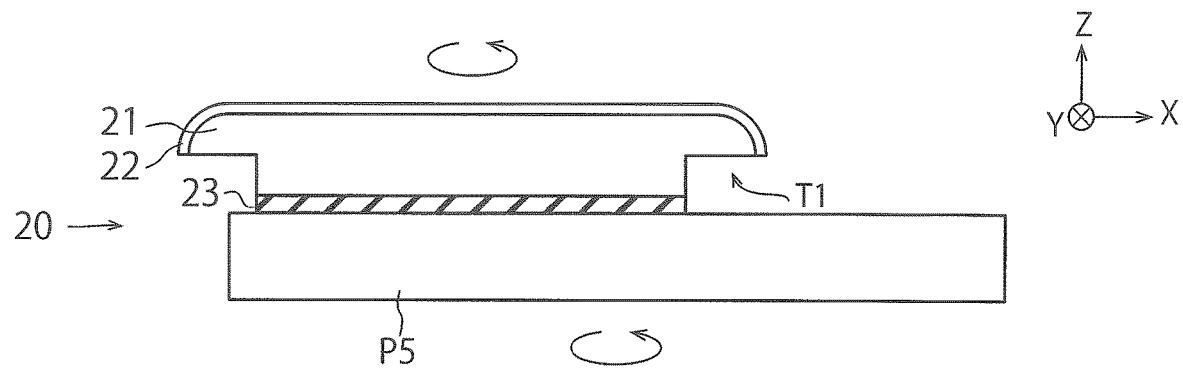
Figure 10B:
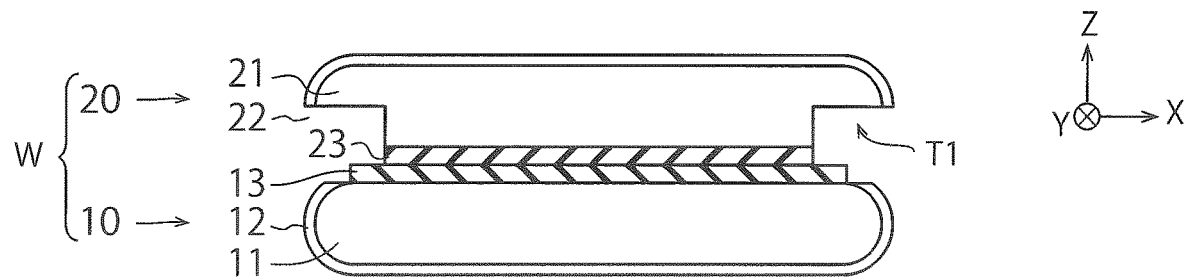
Figure 11A:
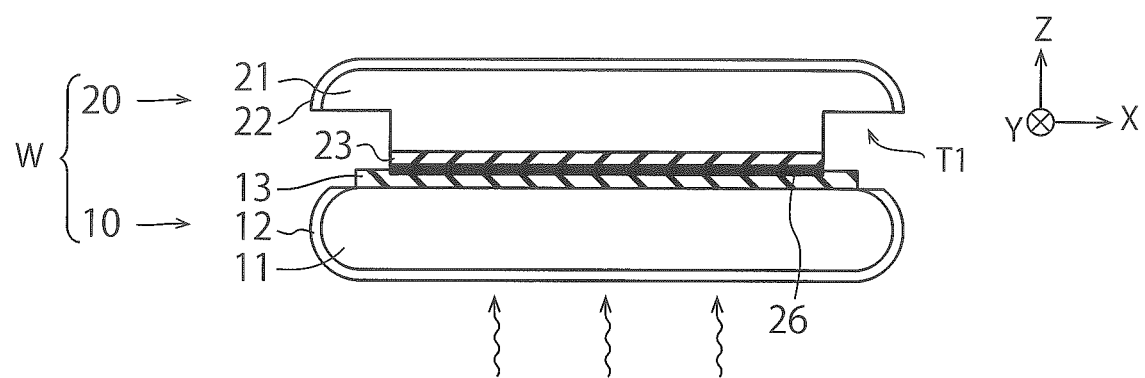
Figure 11B:
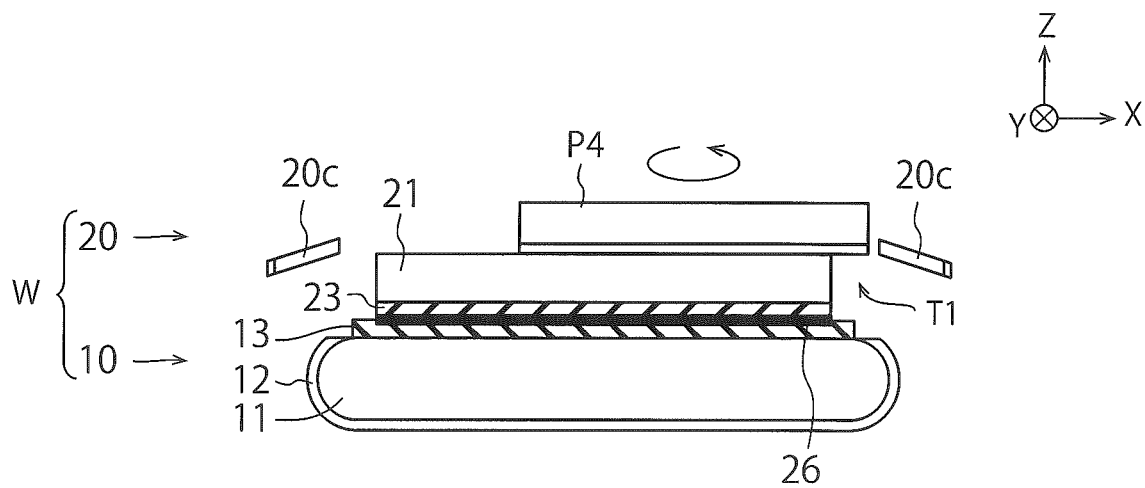

First, the upper wafer 20 illustrated in FIG. 9A is prepared, and the upper wafer 20 is trimmed as illustrated in FIG. 9B. FIG. 9B illustrates a trimming portion T1 of the upper wafer 20. Next, the film 23 in the upper wafer 20 is polished using a CMP (Chemical Mechanical Polishing) device P5 (FIG. 10A), and the upper wafer 20 and the lower wafer 10 are bonded together thereafter (FIG. 10B). Then, by annealing the wafer W, the entire lower face of the film 23 is joined with the upper face of the film 13 (FIG. 11A). Next, by grinding the upper face of the upper wafer 20 by the grinder P4, the upper wafer 20 is made into the thin film (FIG. 11B). At the time, a portion on the trimming portion T1 in the upper wafer 20 is turned to offcuts 20c.

In the present comparative example, when the upper wafer 20 is trimmed in the process of FIG. 9B, the trimming portion T1 is turned into the large amount of powder. In addition, in the present comparative example, when the film 23 is polished in the process of FIG. 10A, there is a risk that an edge of the film 23 is overpolished. However, if the film 23 is not polished, there is a risk that influence of the trimming remains in the film 23. Further, in the present comparative example, troublesome processing for collecting the offcuts 20c is required. On the other hand, the present embodiment makes it possible to suppress these problems.

FIGS. 12A to 13B are sectional views illustrating the method of manufacturing the semiconductor device of a second comparative example of the first embodiment. In the present comparative example, after the lower wafer 10 and the upper wafer 20 are bonded together, the upper wafer 20 is trimmed.

Figure 12A:
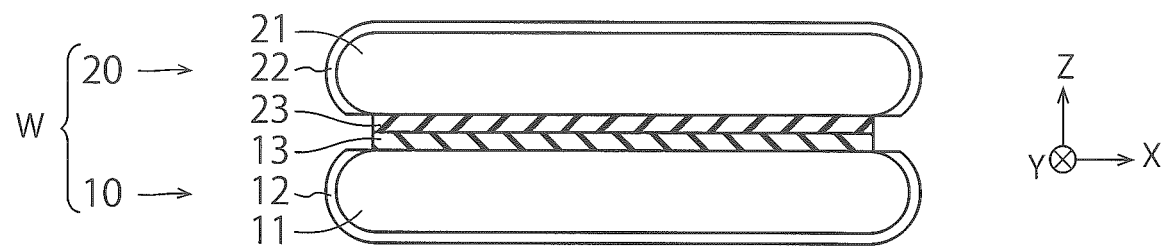
FIGS. 12A to 13B are sectional views illustrating a method of manufacturing a semiconductor device of a second comparative example.
Figure 12B:
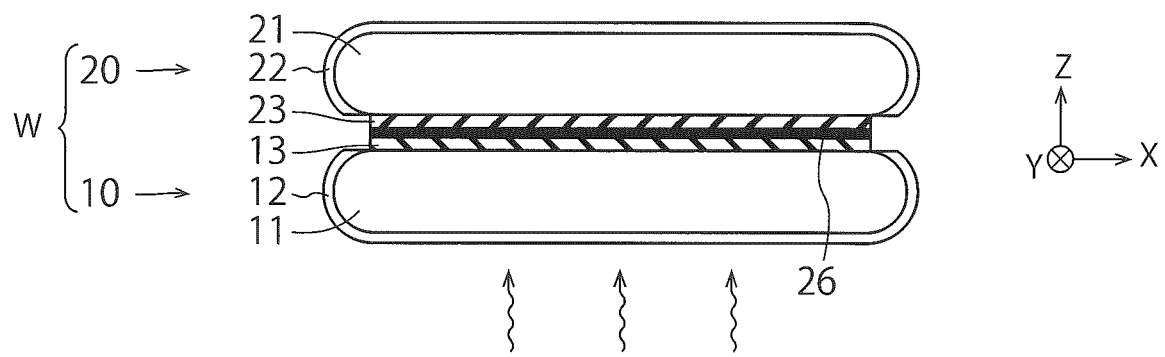
Figure 13A:
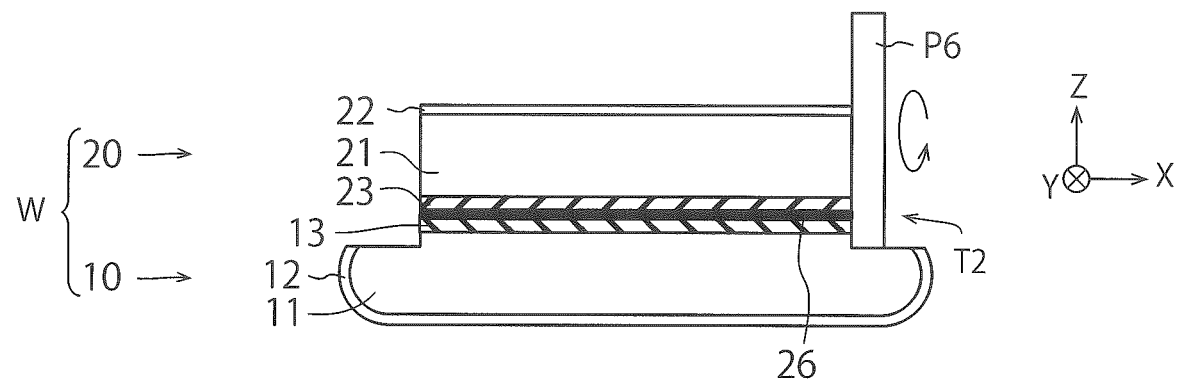
Figure 13B:
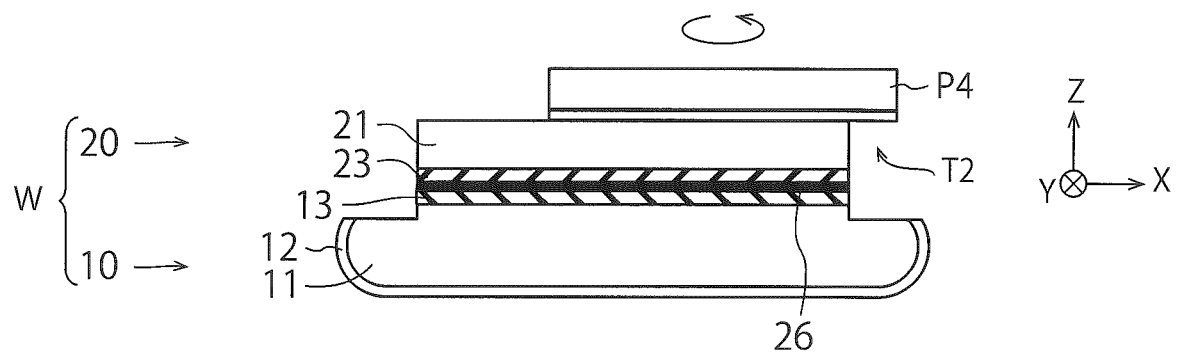

First, the upper wafer 20 is bonded together with the lower wafer 10 (FIG. 12A). Next, by annealing the wafer W, the entire lower face of the film 23 is joined with the upper face of the film 13 (FIG. 12B). Then, the upper wafer 20 is trimmed by a blade P6 (FIG. 13A). FIG. 13A illustrates a trimming portion T2 of the upper wafer 20. Then, by grinding the upper face of the upper wafer 20 by the grinder P4, the upper wafer 20 is made into the thin film (FIG. 14B).

In the present comparative example, when the upper wafer 20 is trimmed in the process of FIG. 13A, the trimming portion T2 is turned into the large amount of powder. In addition, in the present comparative example, when the upper wafer 20 is trimmed in the process of FIG. 13A, there is a risk that not only the upper wafer 20 but also the lower wafer 10 is trimmed. On the other hand, the present embodiment makes it possible to suppress these problems.

FIGS. 14A to 14D are perspective views for describing an operation of the joiner 5 of the first embodiment.

Figure 14A:
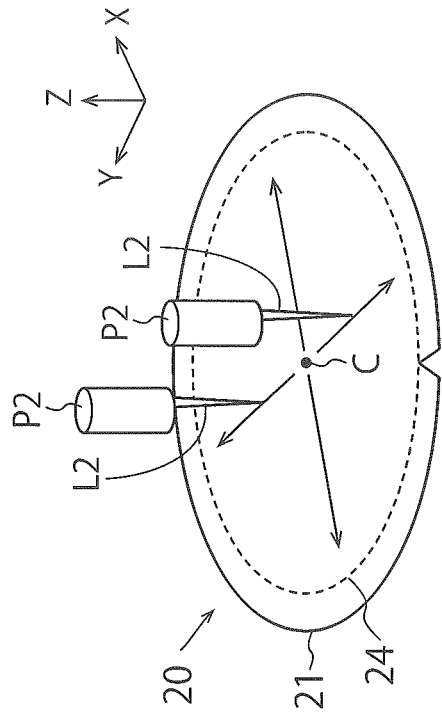
FIGS. 14A to 14D are perspective views for describing an operation of a joiner of the first embodiment.

FIG. 14A illustrates two emitters P2 in the joiner 5. In this way, the joiner 5 of the present embodiment may include two emitters P2 that emit the laser L2. In this case, the joiner 5 may be configured to move the two emitters P2 symmetrically to the center C. In FIG. 14A, one emitter P2 moves in a +X direction, the other emitter P2 moves in a −X direction, and as a result, the emitters P2 move symmetrically to the center C. The emitters P2 move while emitting the laser L2, and the upper wafer 20 (and the lower wafer 10) is scanned by the laser L2 accordingly. The emitters P2 are examples of first and second emitters.

Figure 14C:
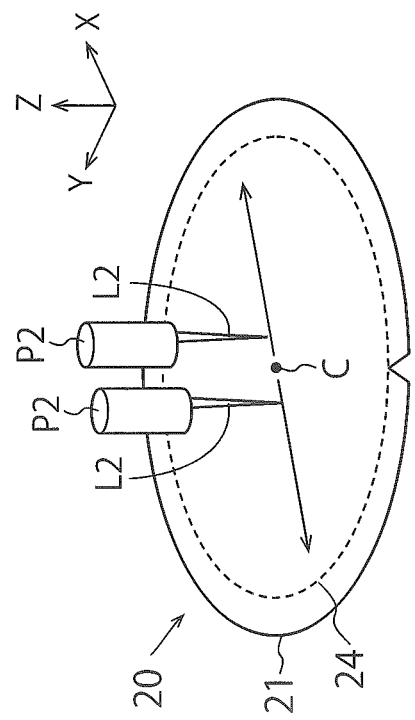
Figure 14B:
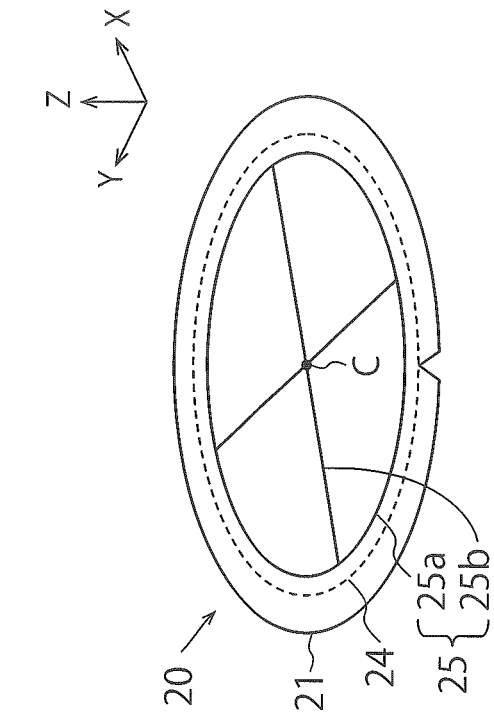

After moving in the directions illustrated in FIG. 14A, the emitters P2 may further move in the directions illustrated in FIG. 14B and FIG. 14C. In FIG. 14B, after the emitters P2 return near the center C, one emitter P2 moves in a +Y direction, and the other emitter P2 moves in a −Y direction. In FIG. 14C, the emitter P2 which has moved in the +Y direction moves clockwise, and the emitter P2 which has moved in the −Y direction also moves clockwise. As a result, the emitters P2 illustrated in FIG. 14B and FIG. 14C also move symmetrically to the center C. However, the emitters P2 illustrated in FIG. 14A and FIG. 14B move in a radial direction of the upper wafer 20, and a position where the upper wafer 20 is irradiated with the laser L2 also moves in the radial direction of the upper wafer 20 accordingly. On the other hand, the emitters P2 illustrated in FIG. 14C move in a circumferential direction of the upper wafer 20, and the position where the upper wafer 20 is irradiated with the laser L2 also moves in the circumferential direction of the upper wafer 20 accordingly.

Figure 14D:
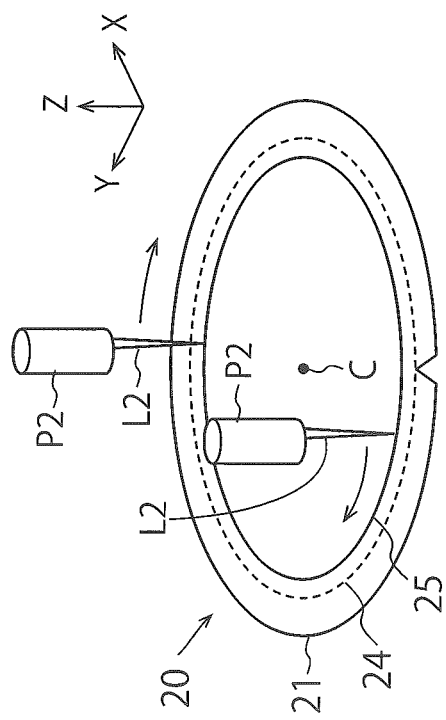

As a result, the joining layer 25 in a shape illustrated in FIG. 14D is formed between the upper wafer 20 and the lower wafer 10. The joining layer 25 illustrated in FIG. 14D includes one joining layer 25a which extends in the circumferential direction of the upper wafer 20 and has a shape of a circumference of a circle, and two joining layers 25b which extend in the radial direction of the upper wafer 20 and have a shape of a diameter of the circle. Since the joining layer 25 includes not only the joining layer 25a but also the joining layers 25b, the joining layer 25 can strongly join the upper wafer 20 and the lower wafer 10 compared to the joining layer 25 including only the joining layer 25a. The joining layer 25a is an example of a first region, and the joining layer 25b is an example of a second region.

Figure 15:
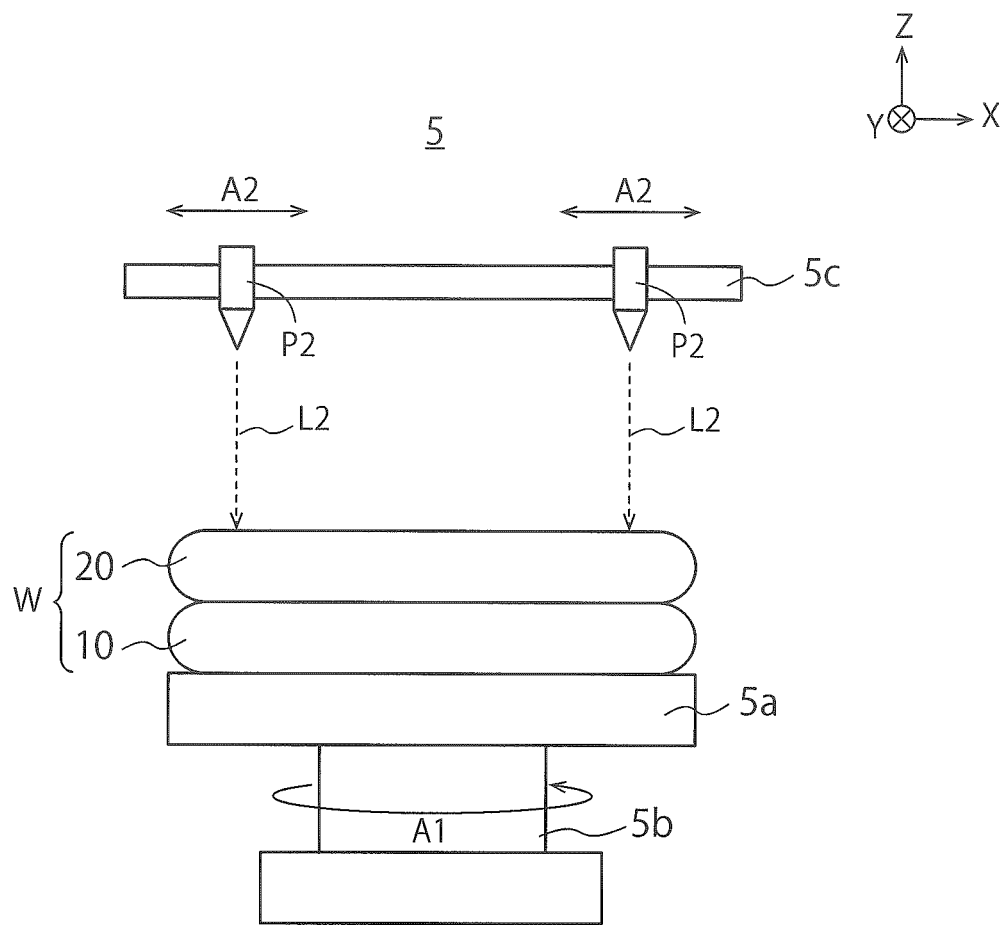
FIG. 15 is a sectional view illustrating the structure of the joiner of the first embodiment.

FIG. 15 is a sectional view illustrating the structure of the joiner 5 of the first embodiment.

The joiner 5 of the present embodiment includes, as illustrated in FIG. 15, the chuck table 5a described above, a rotary shaft 5b, a rod-like member 5c, and the two emitters P2 described above. The chuck table 5a is an example of a table, and the rod-like member 5c is an example of a mover.

FIG. 15 illustrates the wafer W supported by the chuck table 5a. The rotary shaft 5b is attached to the chuck table 5a, and is capable of rotating the wafer W on the chuck table 5a by rotating the chuck table 5a. An arrow A1 illustrates a rotating direction of the rotary shaft 5b.

The rod-like member 5c is a member which has a rod-like shape, and is arranged above the chuck table 5a. The rod-like member 5c holds the two emitters P2, and is capable of moving the emitters P2 along the rod-like member 5c. Arrows A2 illustrate moving directions of the emitters P2.

The rod-like member 5c of the present embodiment is arranged right above (+Z direction) of a rotation center of the rotary shaft 5b. In addition, the wafer W of the present embodiment is loaded on the chuck table 5a such that the center C of the upper wafer 20 is right above the rotation center of the rotary shaft 5b. Therefore, the emitters P2 can move in the radial direction of the upper wafer 20 by moving along the rod-like member 5c. Further, the rod-like member 5c of the present embodiment is configured to move the two emitters P2 symmetrically to the center C.

In the process illustrated in FIG. 14A and FIG. 14B described above, in a state where the rotary shaft 5b stands still, the emitters P2 move along the rod-like member 5c. This makes it possible to move the position where the upper wafer 20 is irradiated with the laser L2 in the radial direction of the upper wafer 20, and form the joining layers 25b.

On the other hand, in the process illustrated in FIG. 14C described above, in the state where the emitters P2 stand still on the rod-like member 5c, the rotary shaft 5b rotates the chuck table 5a. This makes it possible to move the position where the upper wafer 20 is irradiated with the laser L2 in the circumferential direction of the upper wafer 20, and to form the joining layer 25a.

FIGS. 16A to 17C are plan views illustrating examples of the joining layer 25 of the first embodiment.

Figure 16A:
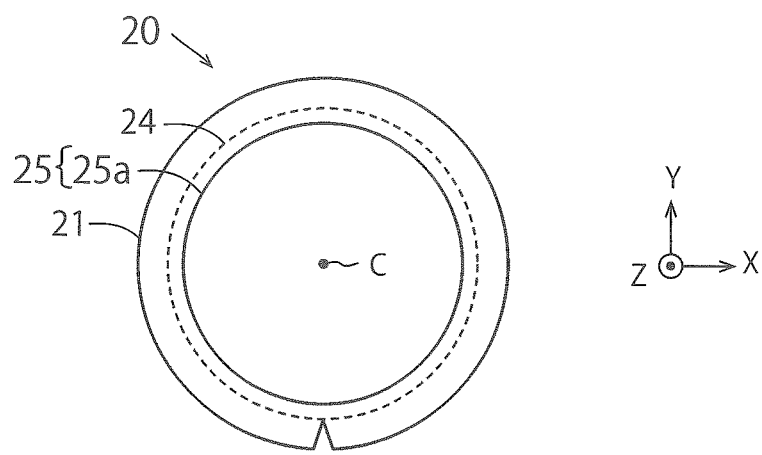
FIGS. 16A to 17C are plan views illustrating examples of a joining layer of the first embodiment.
Figure 16B:
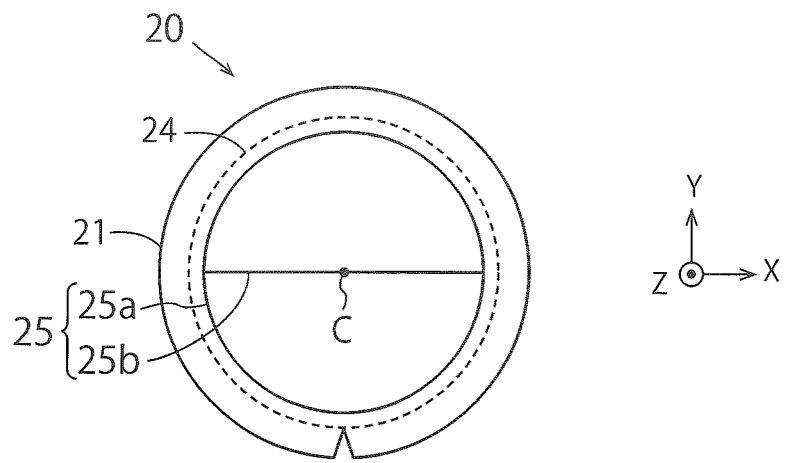
Figure 16C:
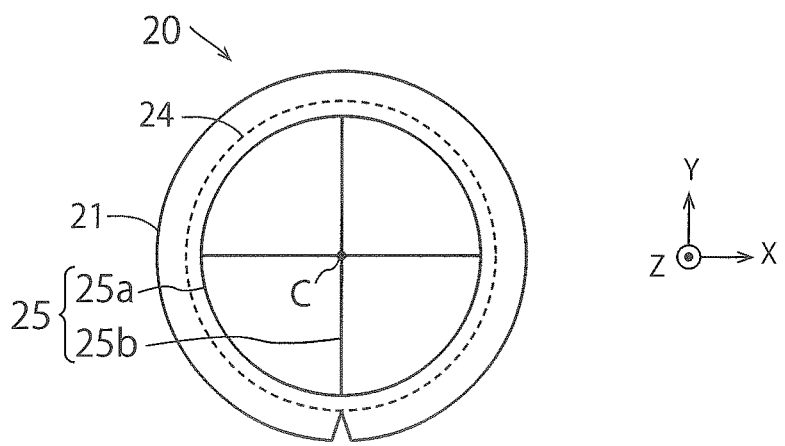

In the example illustrated in FIG. 16A, the joining layer includes only one joining layer 25a extending in the circumferential direction of the upper wafer 20. In the example illustrated in FIG. 16B, the joining layer 25 includes one joining layer 25a extending in the circumferential direction and one joining layer 25b extending in the radial direction of the upper wafer 20. In the example illustrated in FIG. 16C, the joining layer 25 includes one joining layer 25a extending in the circumferential direction and two joining layers 25b extending in the radial direction of the upper wafer 20. The joining layer 25 illustrated in FIG. 16C has the same shape as the joining layer 25 illustrated in FIG. 14D. As described above, the joining layer 25a is an example of the first region, and the joining layer 25b is an example of the second region.

Figure 17A:
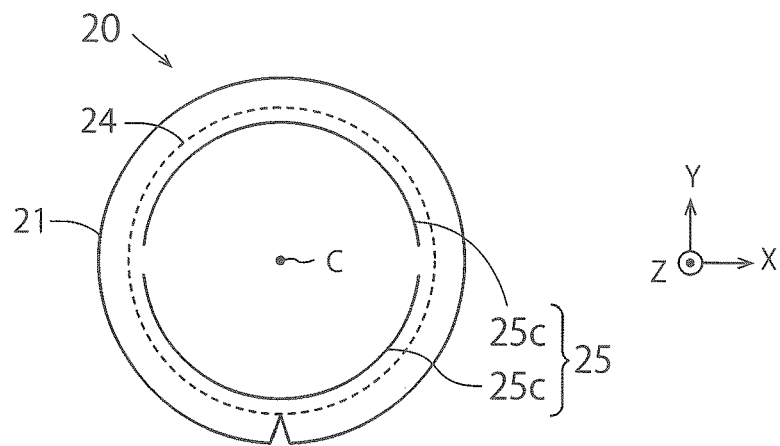

In the example illustrated in FIG. 17A, the joining layer 25 includes two joining layers 25c instead of one joining layer 25a. The joining layers 25c extend in the circumferential direction of the upper wafer 20 similarly to the joining layer 25a. However, while the joining layer 25a has the shape of the circumference for 360 degrees, each of the joining layers 25c has the shape of the circumference (arc) for about 180 degrees. In this way, the joining layer 25 may include the joining layer 25a having an annular shape, or may include the joining layers 25c having a non-annular shape. However, the two joining layers 25c illustrated in FIG. 17A form the shape closer to the annular shape by a combination of the joining layers 25c. The joining layer 25c is an example of the first region.

Figure 17B:
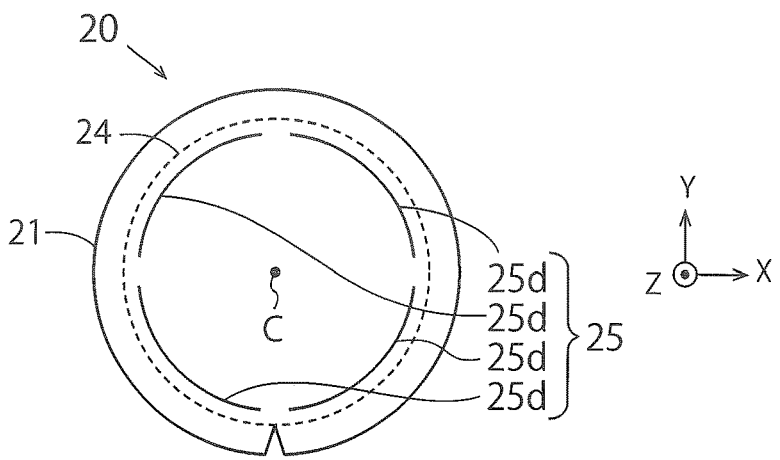

In the example illustrated in FIG. 17B, the joining layer 25 includes four joining layers 25d instead of one joining layer 25a. The joining layers 25d extend in the circumferential direction of the upper wafer 20 similarly to the joining layer 25a and the joining layers 25c. However, while the joining layer 25a has the shape of the circumference for 360 degrees, each of the joining layers 25d has the shape of the circumference (arc) for about 90 degrees. In this way, the joining layer 25 may include the joining layers 25d having the non-annular shape. However, the four joining layers 25d illustrated in FIG. 17B form the shape closer to the annular shape by the combination of the joining layers 25d. The joining layer 25d is an example of the first region.

Figure 17C:
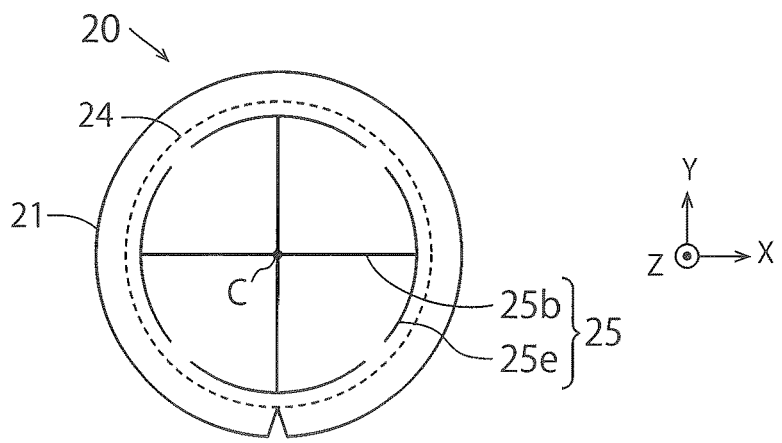

In the example illustrated in FIG. 17C, the joining layer includes four joining layers 25e extending in the circumferential direction of the upper wafer 20, and two joining layers 25b extending in the radial direction of the upper wafer 20. In this way, the joining layer 25 may include the joining layers 25e extending in the circumferential direction of the upper wafer 20 so as to have the non-annular shape and the joining layers 25b extending in the radial direction of the upper wafer 20. The joining layer 25e is an example of the first region.

Figure 18A:
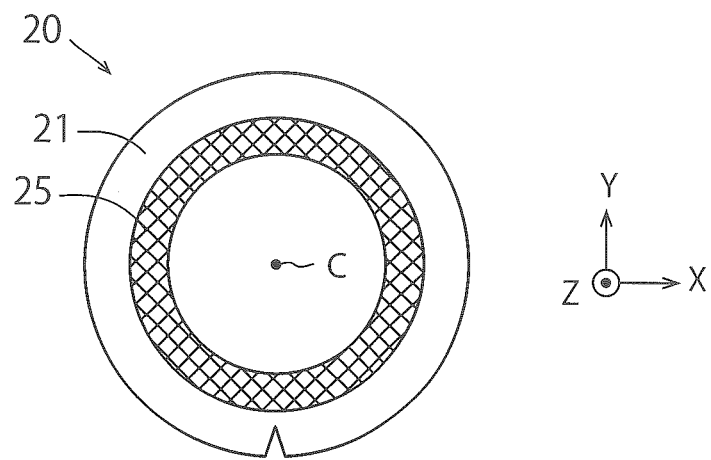
FIGS. 18A and 18B are a plan view and a perspective view for describing the structure of the joiner of a modification of the first embodiment.
Figure 18B:
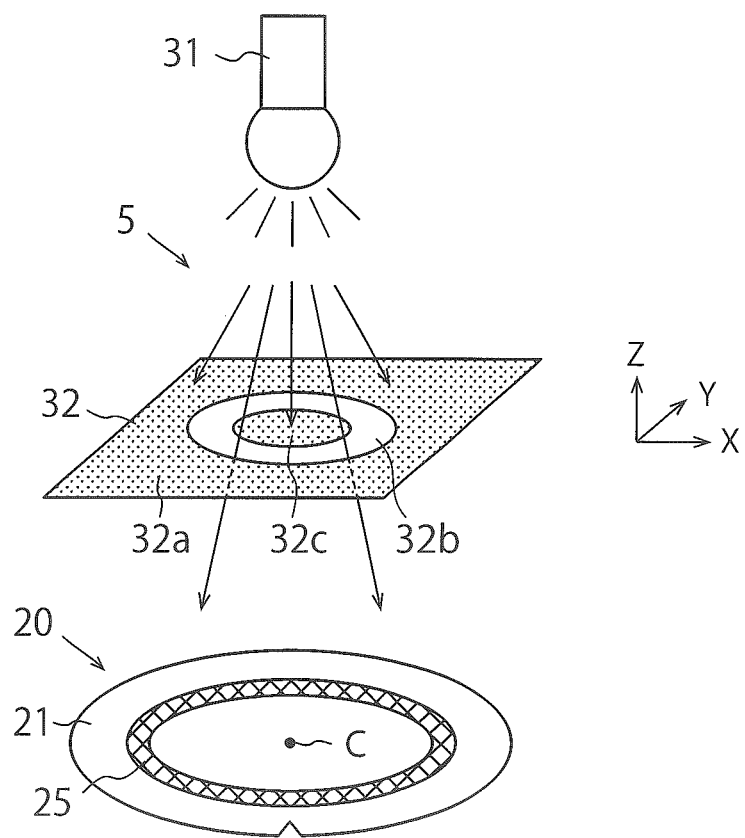

FIGS. 18A and 18B are a plan view and a perspective view for describing the structure of the joiner 5 of a modification of the first embodiment.

FIG. 18A illustrates the upper wafer 20 of the present modification, and the joining layer 25 in the upper wafer 20. The joining layer 25 of the present modification is formed in a region illustrated by cross-hatching in FIG. 18A. Accordingly, the joining layer 25 of the present modification has the annular shape extending in the circumferential direction of the upper wafer 20, and also has a measurable width in the radial direction of the upper wafer 20. When such a joining layer 25 which has the width is to be formed by the laser L2, an irradiation area of the laser L2 becomes wide and it is troublesome. Therefore, the joining layer 25 of the present modification is formed by the joiner 5 illustrated in FIG. 18B, for example.

FIG. 18B illustrates the structure of the joiner 5 of the present modification. The joiner 5 of the present modification includes a light source 31 which generates light, and a mask 32 which shapes the light from the light source 31. With the light shaped by the mask 32, a predetermined region between the upper wafer 20 and the lower wafer 10, that is, the region to form the joining layer 25 is irradiated. As a result, the joining layer 25 is formed in the predetermined region.

The mask 32 of the present modification includes an outer-side light shielding portion 32a, a light transmitting portion 32b and an inner-side light shielding portion 32c. The inner-side light shielding portion 32c has the circular planar shape. The light transmitting portion 32b has a planar shape having circular inner circumference and outer circumference, and annularly surrounds the inner-side light shielding portion 32c. The outer-side light shielding portion 32a has a planar shape having a circular inner circumference and a square or rectangular outer circumference, and annularly surrounds the light transmitting portion 32b. The inner-side light shielding portion 32c is an example of a first light shielding portion, and the outer-side light shielding portion 32a is an example of a second light shielding portion.

The outer-side light shielding portion 32a and the inner-side light shielding portion 32c have a property of shielding the light from the light source 31. On the other hand, the light transmitting portion 32b has a property of transmitting the light from the light source 31. Accordingly, the light made incident on the mask 32 from the light source 31 is transmitted through the light transmitting portion 32b and the predetermined region described above is irradiated with the light. As a result, the joiner 5 having the shape illustrated in FIG. 18B is formed between the upper wafer 20 and the lower wafer 10. The present modification makes it possible to easily form the joining layer 25 having the measurable width.

The outer-side light shielding portion 32a and the inner-side light shielding portion 32c can be formed with an arbitrary material capable of shielding the light. On the other hand, the light transmitting portion 32b may be formed by not arranging a member between the outer-side light shielding portion 32a and the inner-side light shielding portion 32c or may be formed by arranging a member capable of transmitting the light between the outer-side light shielding portion 32a and the inner-side light shielding portion 32c.

Figure 19B:
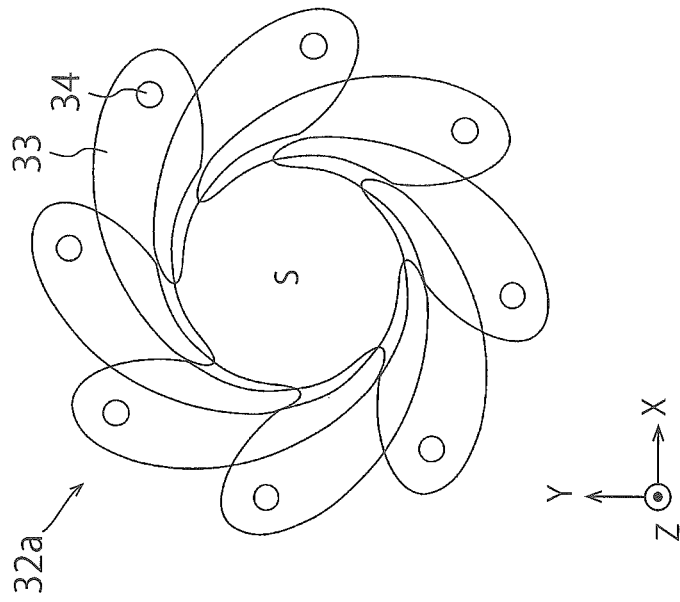
FIGS. 19A and 19B are plan views illustrating an example of an outer-side light shielding portion of the modification of the first embodiment.
Figure 19A:
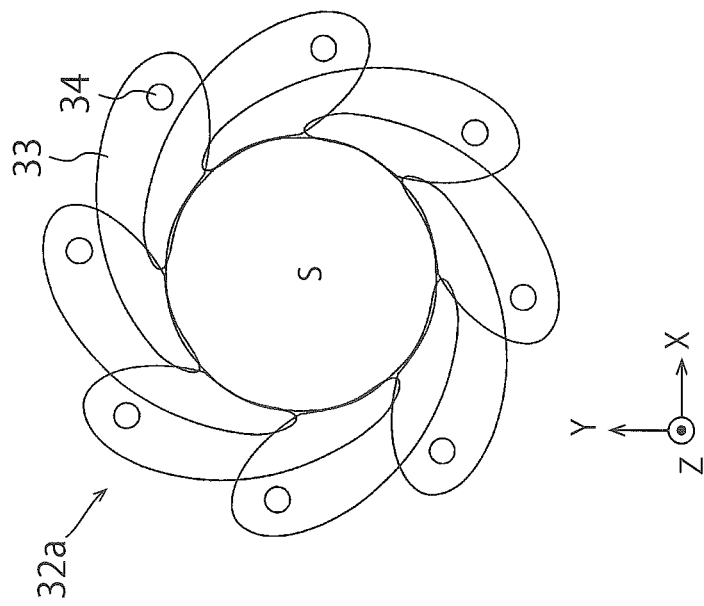

FIGS. 19A and 19B illustrate an example of the outer-side light shielding portion 32a of the modification of the first embodiment.

The outer-side light shielding portion 32a illustrated in FIG. 19A includes a plurality of light shielding members 33 which shield the light from the light source 31. The light shielding members 33 are arranged so as to form a circular space S. In this case, the inner-side light shielding portion 32c is arranged in the space S, and a gap between the outer-side light shielding portion 32a and the inner-side light shielding portion 32c becomes the light transmitting portion 32b.

Each of the light shielding members 33 is rotatable around a rotary shaft 34. In the present modification, by each of the light shielding members 33 rotating around the rotary shaft 34, the shape of the space S can be deformed. Specifically, a diameter of the space S can be increased or decreased. FIG. 19B illustrates the space S the diameter of which is decreased compared to the space S in FIG. 19A.

The present modification makes it possible to change the shape of the predetermined region by deforming the shape of the space S. For example, when the diameter of the space S is decreased, the outer circumference of the predetermined region becomes small and an area of the predetermined region becomes small.

Figure 20A:
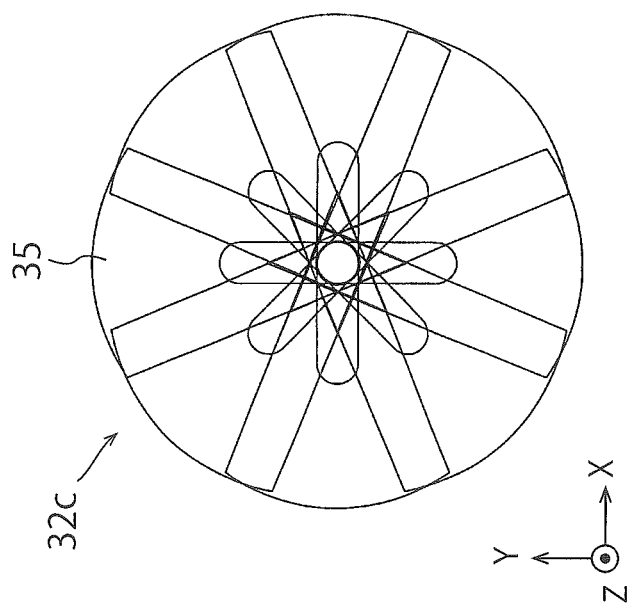
FIGS. 20A and 20B are plan views illustrating an example of an inner-side light shielding portion of the modification of the first embodiment.
Figure 20B:
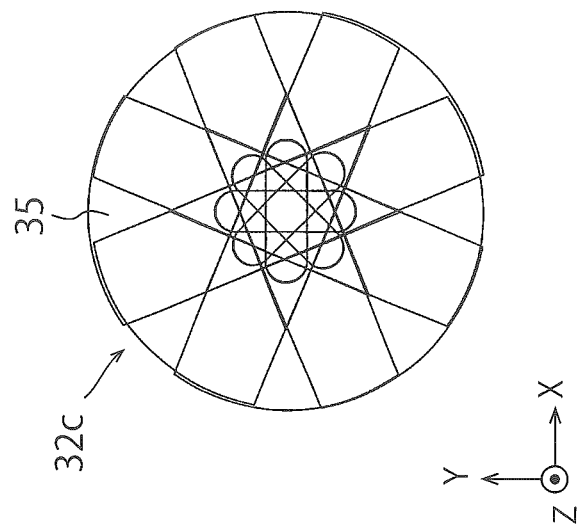

FIGS. 20A and 20B are plan views illustrating an example of the inner-side light shielding portion 32c of the modification of the first embodiment.

The inner-side light shielding portion 32c illustrated in FIG. 20A includes a plurality of light shielding members 35 which shield the light from the light source 31. The light shielding members 35 are arranged so as to form the circular inner-side light shielding portion 32c. In this case, the outer-side light shielding portion 32a is arranged so as to annularly surround the inner-side light shielding portion 32c, and the gap between the outer-side light shielding portion 32a and the inner-side light shielding portion 32c becomes the light transmitting portion 32b.

The light shielding members 35 can slide while keeping the shape of the inner-side light shielding portion 32c circular. Specifically, the light shielding members 35 can move back and forth with a center axis of the shape of the inner-side light shielding portion 32c as an origin. In the present modification, by the light shielding members 35 sliding, the shape of the inner-side light shielding portion 32c can be deformed. Specifically, the diameter of the inner-side light shielding portion 32c can be increased or decreased. FIG. 20B illustrates the inner-side light shielding portion 32c the diameter of which is decreased compared to the inner-side light shielding portion 32c in FIG. 20A.

The present modification makes it possible to change the shape of the predetermined region by deforming the shape of the inner-side light shielding portion 32c. For example, when the diameter of the inner-side light shielding portion 32c is decreased, the inner circumference of the predetermined region becomes small, and the area of the predetermined region becomes large.

The mask 32 of the present modification may include both of the structure in FIG. 19A and the structure in FIG. 20A, may include only one of the structure in FIG. 19A and the structure in FIG. 20A, or may include neither of the structure in FIG. 19A and the structure in FIG. 20A.

FIGS. 21A to 21D are sectional views illustrating details of the method of manufacturing the semiconductor device of the first embodiment, and specifically illustrates the details of the process illustrated in FIG. 5A and FIG. 5B.

Figure 21A:
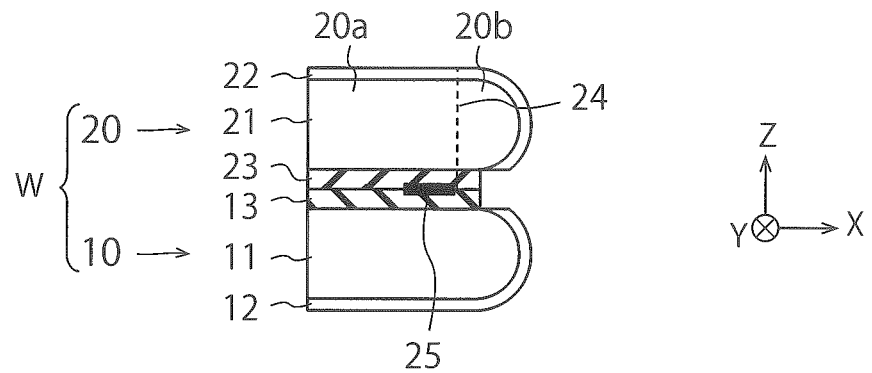
FIGS. 21A to 21D are sectional views illustrating details of the method of manufacturing the semiconductor device of the first embodiment.
Figure 21B:
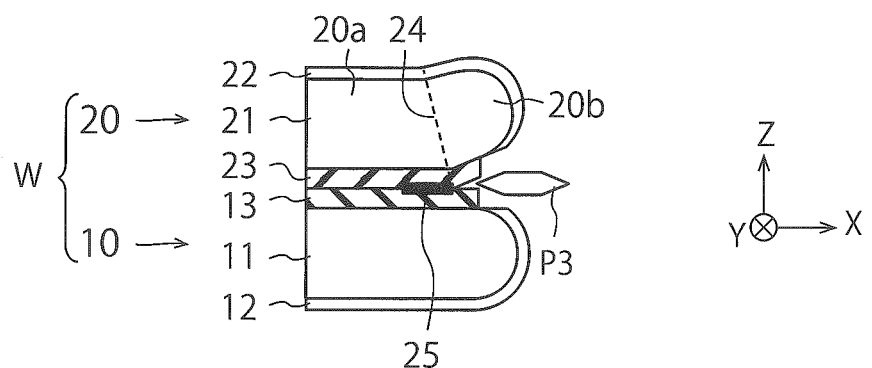

FIG. 21A illustrates the reformed layer 24 and the joining layer 25 formed in the wafer W. In the process, the blade P3 is inserted between the lower wafer 10 and the upper wafer 20, and the wafer W is rotated in the state where the blade P3 is inserted (FIG. 21B). The blade P3 in FIG. 21B is inserted between the film 13 and the film 23. The process of FIG. 21B may be performed using only one blade P3, or may be performed using two or more blades P3 simultaneously.

Figure 21C:
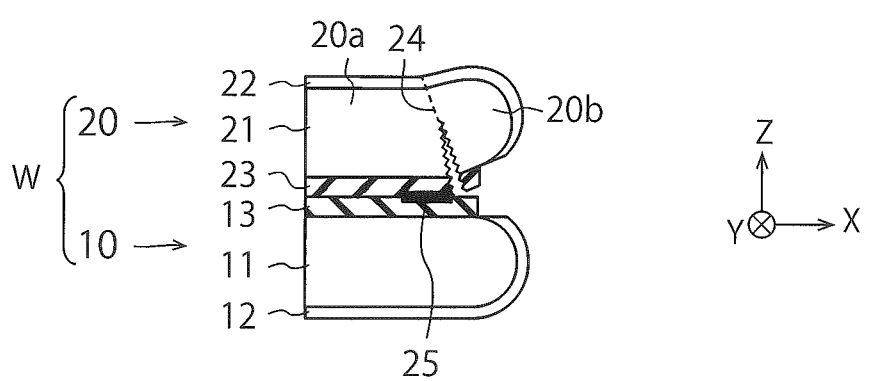
Figure 21D:
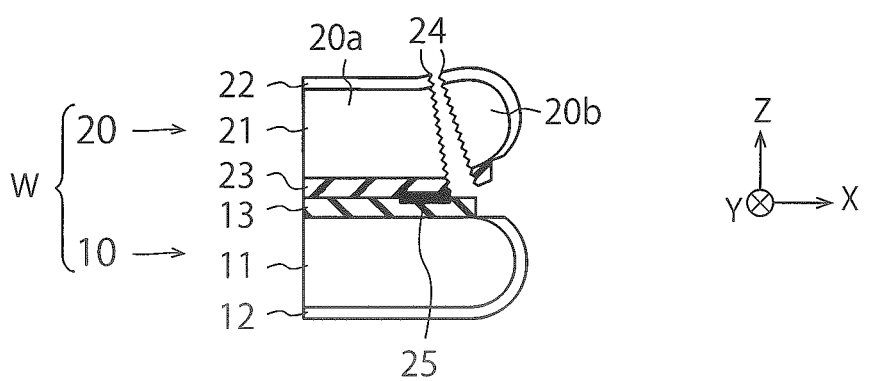

As illustrated in FIG. 21B, the outer peripheral portion 20b is peeled from the lower wafer 10 by the force applied from the blade P3. The outer peripheral portion 20b is not joined with the lower wafer 10 by the joining layer 25 and thus is easily peeled from the lower wafer 10. On the other hand, the center portion 20a is joined with the lower wafer 10 by the joining layer 25 so that the center portion 20a is not peeled from the lower wafer 10 even when the force is applied from the blade P3. Therefore, the strain is accumulated on the interface of the lower wafer 10 and the upper wafer 20, and the stress is released in the form of destroying the reformed layer 24. FIG. 21C illustrates a situation where the reformed layer 24 is cracked. FIG. 21D illustrates a situation where this crack passes through the upper wafer 20. The reformed layer 24 of the present embodiment is amorphized and thus prone to cracking.

As a result, the center portion 20a and the outer peripheral portion 20b are separated at the reformed layer 24, and the outer peripheral portion 20b is completely peeled from the lower wafer 10. In such a manner, the outer peripheral portion 20b is removed from the surface of the lower wafer 10 and the center portion 20a remains on the surface of the lower wafer 10.

Figure 22A:
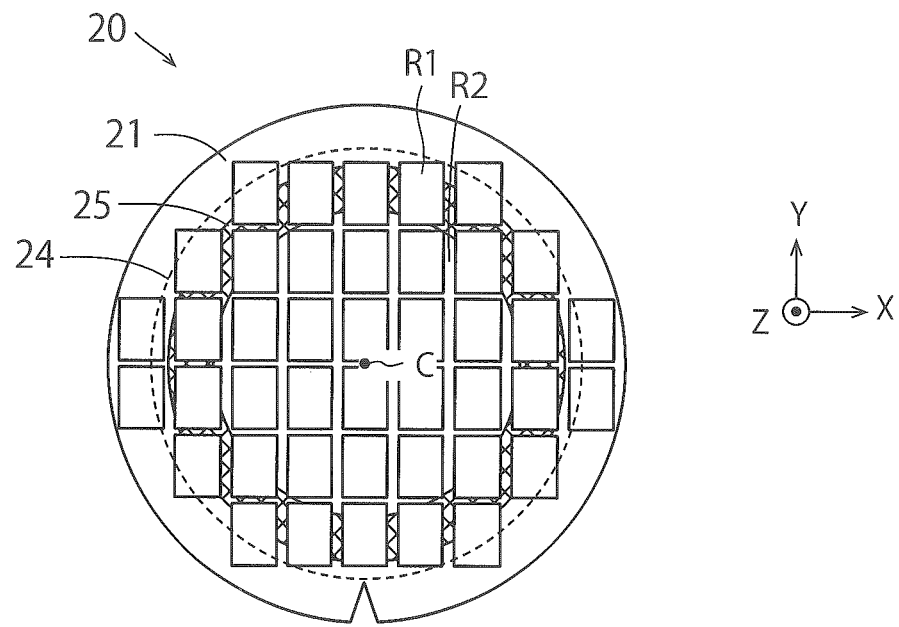
FIGS. 22A and 22B are other plan view and sectional view illustrating the details of the method of manufacturing the semiconductor device of the first embodiment.
Figure 22B:
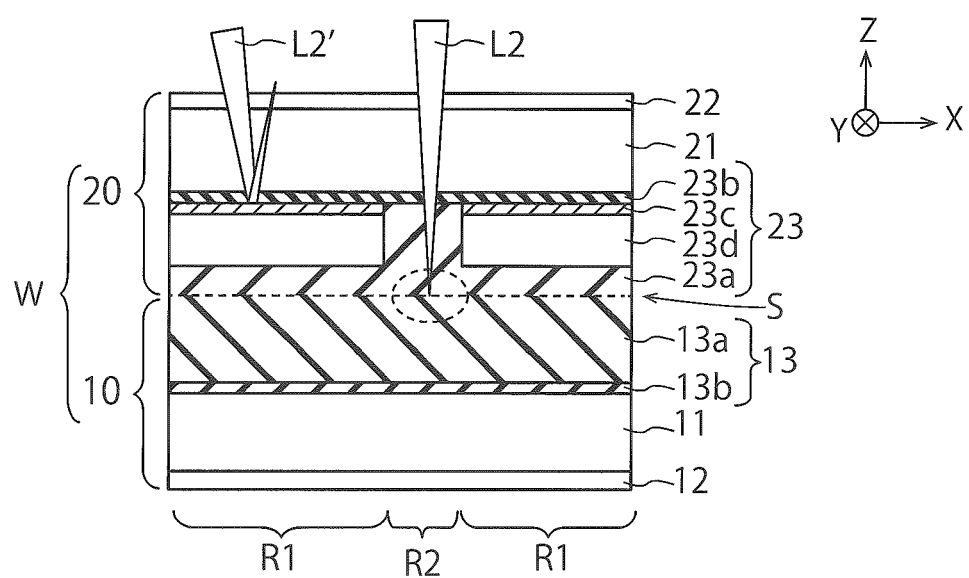

FIGS. 22A and 22B are other plan view and sectional view illustrating the details of the method of manufacturing the semiconductor device of the first embodiment.

FIG. 22A illustrates a plurality of chip regions R1 and a scribe region R2 in the upper wafer 20. The chip regions R1 are the regions to be individual semiconductor devices (semiconductor chips) after dicing the wafer W. The scribe region R2 is the region where a dicer is to be applied when dicing the wafer W.

The reformed layer 24 illustrated in FIG. 22A is arranged on one circumference similarly to the reformed layer 24 illustrated in FIG. 3B or the like. Accordingly, the reformed layer 24 illustrated in FIG. 22A is formed in the chip regions R1 and the scribe region R2. On the other hand, the joining layer 25 illustrated in FIG. 22A is arranged on one circumference similarly to the joining layer 25 illustrated in FIG. 4B or the like, but is broken off in the chip regions R1. Accordingly, the joining layer 25 illustrated in FIG. 22A is formed only in the scribe region R2 of the chip regions R1 and the scribe region R2.

FIG. 22B illustrates the upper wafer 20 illustrated in FIG. 22A and the lower wafer 10 under the upper wafer 20. In FIG. 22B, the film 13 includes an insulator 13a and an insulator 13b, and the film 23 includes an insulator 23a, an insulator 23b, a metal film 23c and a laminated film 23d. The laminated film 23d includes a word line and a selector gate of a three-dimensional semiconductor memory, for example. The metal film 23c is formed as a line layer for the laminated film 23d, for example. The metal film 23c and the laminated film 23d of the present embodiment are formed only in the chip regions R1 of the chip regions R1 and the scribe region R2.

FIG. 22B further illustrates the laser L2 made incident on the scribe region R2 from the emitter P2, and the laser L2 (expressed as "L2'" for differentiation) made incident on the chip regions R1 from the emitter P2. Generally, the metal film 23c has the property of reflecting the laser L2. Accordingly, the laser L2' which is the laser L2 made incident on the chip regions R1 is reflected on the metal film 23c and does not reach the interface of the film 13 and the film 23. This is the reason why the joining layer 25 illustrated in FIG. 22A is not formed in the chip regions R1.

In FIG. 22A, since the joining layer 25 is not formed in the chip regions R1, there is a possibility that joining strength by the joining layer 25 between the upper wafer 20 and the lower wafer 10 becomes insufficient. However, according to a verification, even in the case where the joining layer 25 is formed only in the scribe region R2, the joining strength by the joining layer 25 between the upper wafer 20 and the lower wafer 10 can be sufficiently secured. Accordingly, the joining layer 25 of the present embodiment may be formed to have the shape illustrated in FIG. 22A. When it is desired to improve the joining strength by the joining layer 25, the joining layer 25 may be formed to include the joining layer 25b described above, or the joining layer 25 may be formed to have the measurable width by the joiner 5 illustrated in FIG. 18B. The joining layer 25 illustrated in FIG. 22A is formed to have the measurable width similarly to the joining layer 25 illustrated in FIG. 18A.

Similarly, according to the verification, even in the case where the reformed layer 24 is formed only in the scribe region R2, the process illustrated in FIG. 5A and FIG. 5B can be performed. Accordingly, the reformed layer 24 of the present embodiment may be formed to have the shape illustrated in FIG. 22A.

As above, in the present embodiment, the reformed layer 24 and the joining layer 25 are formed in the wafer W, and the outer peripheral portion 20b of the upper wafer 20 is removed from the wafer W by using the reformed layer 24 and the joining layer 25. Accordingly, the present embodiment makes it possible to remove the outer peripheral portion 20b without turning the outer peripheral portion 20b into the large amount of powder for example, and suitably process the wafer W.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
  a reformer configured to partially reform a first substrate to form a reformed layer between a first portion and a second portion in the first substrate;
  a joiner configured to form a joining layer between the first portion and a second substrate to join the first portion and the second substrate; and
  a remover configured to remove the second portion from a surface of the second substrate while making the first portion remain on the surface of the second substrate by separating the first portion and the second portion, wherein
  the joining layer is formed only in the first portion of the first and second portions.

2. The apparatus of claim 1, wherein the reformer forms an amorphous layer as the reformed layer by partially amorphizing the first substrate.

3. The apparatus of claim 1, wherein the reformer partially reforms the first substrate with a laser.

4. The apparatus of claim 1, wherein the joiner forms the joining layer with a laser.

5. The apparatus of claim 4, wherein the laser of the joiner generates heat by being absorbed by the first and second substrates, and forms the joining layer by causing dehydration condensation by the heat in the first and second substrates.

6. The apparatus of claim 4, wherein the joiner is configured to move a position where the first substrate is irradiated with the laser, in a radial direction and a circumferential direction of the first substrate.

7. The apparatus of claim 6, wherein
the joiner comprises:
an emitter configured to emit the laser;
a table configured to support the first and second substrates;
a rotary shaft configured to rotate the table; and
a mover configured to move the emitter in the radial direction of the table,
the mover moves the emitter to move the position where the first substrate is irradiated with the laser, in the radial direction of the first substrate, and
the rotary shaft rotates the table to move the position where the first substrate is irradiated with the laser, in the circumferential direction of the first substrate.

8. The apparatus of claim 6, wherein
an emitter includes first and second emitters configured to emit the laser, and
a mover moves the first and second emitters symmetrically to a center of the first substrate.

9. The apparatus of claim 1, wherein
the joiner includes a light source configured to generate light, and a mask configured to shape the light, and
the joiner irradiates a predetermined region between the first substrate and the second substrate with the light shaped by the mask to form the joining layer in the predetermined region.

10. The apparatus of claim 9, wherein
the mask includes a first light shielding portion, and a second light shielding portion annularly surrounding the first light shielding portion, and
the mask irradiates the predetermined region with the light transmitted through a light transmitting portion between the first light shielding portion and the second light shielding portion.

11. The apparatus of claim 10, wherein the mask is configured to change a shape of the predetermined region by deforming a shape of at least either of the first and second light shielding portions.

12. The apparatus of claim 1, wherein the remover removes the second portion by inserting an inserting member between the first substrate and the second substrate to peel the second portion from the second substrate.

13. The apparatus of claim 12, further comprising a conveying mechanism configured to convey the second portion peeled from the second substrate.

* * * * *